(12) United States Patent
Sekiguchi et al.

(10) Patent No.: US 9,051,469 B2
(45) Date of Patent: Jun. 9, 2015

(54) COLORING MATTER COMPOUND, INK, HEAT-SENSITIVE TRANSFER RECORDING SHEET, AND RESIST COMPOSITION FOR COLOR FILTER

(71) Applicant: CANON KABUSHIKI KAISHA, Tokyo (JP)

(72) Inventors: Takeshi Sekiguchi, Tokyo (JP); Shosei Mori, Hiratsuka (JP); Taichi Shintou, Saitama (JP); Takeshi Miyazaki, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/179,742

(22) Filed: Feb. 13, 2014

(65) Prior Publication Data

US 2014/0163212 A1 Jun. 12, 2014

Related U.S. Application Data

(63) Continuation of application No. PCT/JP2013/004999, filed on Aug. 23, 2013.

(30) Foreign Application Priority Data

Aug. 24, 2012 (JP) ............................ 2012-184755
Aug. 22, 2013 (JP) ............................ 2013-172347

(51) Int. Cl.
| | |
|---|---|
| *C09B 33/12* | (2006.01) |
| *C09D 11/328* | (2014.01) |
| *C09B 35/34* | (2006.01) |
| *C09D 11/00* | (2014.01) |
| *G02B 5/20* | (2006.01) |
| *B41M 5/42* | (2006.01) |
| *G03F 7/00* | (2006.01) |

(52) U.S. Cl.
CPC ............... *C09B 35/34* (2013.01); *C09B 33/12* (2013.01); *C09D 11/328* (2013.01); *C09D 11/00* (2013.01); *G02B 5/20* (2013.01); *B41M 5/423* (2013.01); *G03F 7/0007* (2013.01)

(58) Field of Classification Search
CPC .............................. C09B 33/12; C09D 11/328
USPC ....................................... 534/758; 106/31.48
See application file for complete search history.

(56) References Cited

U.S. PATENT DOCUMENTS

| | | | |
|---|---|---|---|
| 6,878,196 | B2 | 4/2005 | Harada et al. |
| 7,507,282 | B2 | 3/2009 | Ozawa et al. |
| 7,510,605 | B2 | 3/2009 | Harada et al. |
| 7,553,358 | B2 | 6/2009 | Okamura et al. |
| 7,981,206 | B2 | 7/2011 | Nakata et al. |
| 8,062,383 | B2 | 11/2011 | Tateishi |
| 8,080,067 | B2 | 12/2011 | Tateishi et al. |
| 8,101,011 | B2 | 1/2012 | Tateishi et al. |
| 8,222,410 | B2 | 7/2012 | Tateishi et al. |
| 8,262,789 | B2 | 9/2012 | Tateishi et al. |
| 8,399,664 | B2 | 3/2013 | Tateishi et al. |
| 8,523,990 | B2 | 9/2013 | Tanaka et al. |
| 8,523,991 | B2 | 9/2013 | Tanaka et al. |
| 2012/0095195 | A1 | 4/2012 | Tateishi et al. |

FOREIGN PATENT DOCUMENTS

| | | |
|---|---|---|
| JP | 2000-62327 A | 2/2000 |
| JP | 2003-277662 A | 10/2003 |
| JP | 2007-197538 A | 8/2007 |
| JP | 2008-297541 A | 12/2008 |
| JP | 2009-287013 A | 12/2009 |
| JP | 2009-298966 A | 12/2009 |
| JP | 2010-024444 A | 2/2010 |
| JP | 2010-31224 A | 2/2010 |
| JP | 4810123 B2 | 11/2011 |
| JP | 2012-001627 A | 1/2012 |

OTHER PUBLICATIONS

English Language Translation of the International Preliminary Report on Patentability in International Application No. PCT/JP2013/004999 (mailed Mar. 5, 2015).

*Primary Examiner* — Robert Havlin
(74) *Attorney, Agent, or Firm* — Fitzpatrick, Cella, Harper & Scinto

(57) ABSTRACT

The present invention relates to a coloring matter compound that has high saturation and is excellent in light resistance. The coloring matter compound is represented by the following general formula (1):

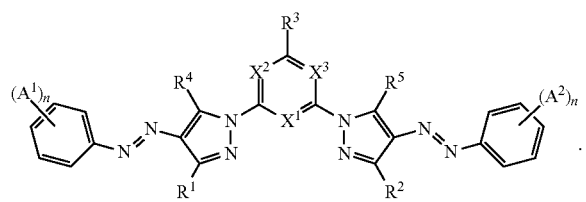

6 Claims, 1 Drawing Sheet

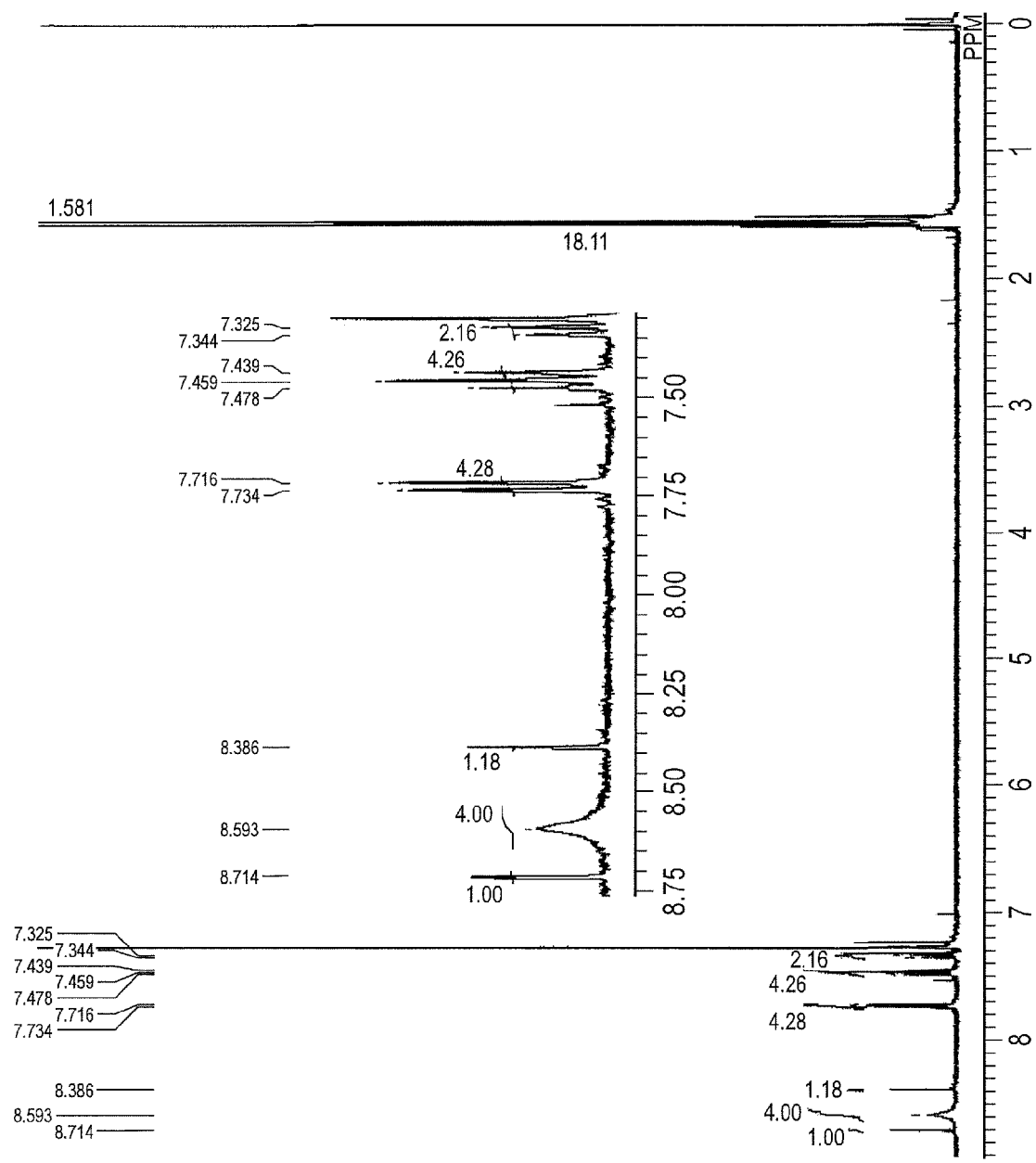

COLORING MATTER COMPOUND, INK, HEAT-SENSITIVE TRANSFER RECORDING SHEET, AND RESIST COMPOSITION FOR COLOR FILTER

CROSS-REFERENCE TO RELATED APPLICATIONS

This application is a continuation of International Application No. PCT/JP2013/004999, filed Aug. 23, 2013, which claims the benefit of Japanese Patent Applications No. 2012-184755, filed Aug. 24, 2012, and No. 2013-172347, filed Aug. 22, 2013.

BACKGROUND OF THE INVENTION

1. Field of the Invention

The present invention relates to a coloring matter compound, and an ink, a heat-sensitive transfer recording sheet and a resist composition for a color filter all containing the coloring matter compound.

2. Description of the Related Art

Recently, there have been increasing demands for image quality improvement for color images in a color liquid crystal display and the like. A color filter is an indispensable component that affects the performance in the image quality improvement of a liquid crystal display. Furthermore, in order to display or record full color images, color filters use coloring matters of the three primary colors of what is called additive color mixture or subtractive color mixture. Therefore, it is strongly desired to develop coloring matters that have absorption characteristics for realizing preferable color reproduction ranges and can endure various use conditions and environmental conditions.

For example, azo compounds have been widely used in a variety of fields including coating materials, inkjet inks and color filters. Among the azo compounds, a pyrazole azo compound has been conventionally used for color filters because the compound can be easily synthesized. Since the pyrazole azo compound is, however, a dye in general, light resistance thereof is low. For improving this property, a pyrazole azo compound prepared in the form of a pigment has been recently reported (see Patent Literatures 1 to 3). Although the light resistance becomes higher owing to characteristics of a pigment, there arises a problem in which saturation is lowered instead, and hence, it is desired to develop a coloring matter compound that is excellent in both light resistance and saturation.

Moreover, a coloring matter compound is desired to be improved in technical fields other than the field of color filters. An example of such fields includes a field of image formation employing a heat-sensitive transfer recording method.

The heat-sensitive transfer recording method is an image formation method by which recording is performed as follows: A heat-sensitive transfer sheet formed on a sheet-shaped substrate and including a coloring material layer containing a thermally migratory coloring matter is overlaid on an image receiving sheet having, on a surface thereof, a coloring matter receiving layer, and the heat-sensitive transfer sheet is heated so as to transfer the coloring matter included in the heat-sensitive transfer sheet onto the image receiving sheet. In this heat-sensitive transfer recording method, a coloring matter compound contained in a transfer sheet and an ink composition for the transfer sheet is an extremely significant material because this compound affects the speed of the transfer recording, image quality of recorded products, and storage stability. As a dye to be used in the heat-sensitive transfer recording method, methine disperse dyes such as C.I. Disperse Yellow 201, disazo disperse dyes such as C.I. Disperse Orange 13, and pyridone azo dyes have been proposed (see Patent Literature 4). These dyes have, however, a problem in which the light resistance is low, and even now, a coloring matter compound having further improved light resistance is desired to be developed.

CITATION LIST

Patent Literature

PTL 1: Japanese Patent Application Laid-Open No. 2010-31224
PTL 2: Japanese Patent Application Laid-Open No. 2012-1627
PTL 3: Japanese Patent No. 4810123
PTL 4: Japanese Patent Application Laid-Open No. 2000-62327

SUMMARY OF THE INVENTION

The present invention is directed to providing a coloring matter compound that has high saturation and is excellent in light resistance, and an ink, a heat-sensitive transfer recording sheet and a resist composition for a color filter all containing the coloring matter compound.

According to one aspect of the present invention, there is provided a coloring matter compound having a structure represented by the following general formula (1):

General formula (1)

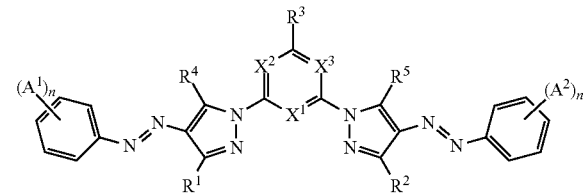

wherein $R^1$ and $R^2$ each independently represent a hydrogen atom, an alkyl group or an aryl group, $R^3$ represents a hydrogen atom, an alkyl group, an aryl group, an alkoxy group or a hydroxy group, $R^4$ and $R^5$ each independently represent a hydrogen atom or an amino group, $X^1$ to $X^3$ each independently represent a carbon atom or a nitrogen atom, $A^1$ and $A^2$ each independently represent a hydrogen atom, an alkyl group, an alkoxy group, an aryl group, a carbamoyl group, a carboxylic acid ester group, a carboxylic acid amide group, a sulfonic acid ester group, a sulfonic acid amide group, a trifluoromethyl group, a cyano group, a hydroxy group, a nitro group, an amino group or a halogen atom, and n represents an integer of 1 to 5.

According to another aspect of the present invention, there is provided an ink comprising the above-described coloring matter compound.

According to further aspect of the present invention, there is provided a heat-sensitive transfer recording sheet comprising a substrate and a coloring material layer formed on the substrate and containing the aforementioned coloring matter compound.

According to still further aspect of the present invention, there is provided a resist composition for a color filter comprising the aforementioned coloring matter compound.

Advantageous Effects of Invention

According to the present invention, a coloring matter compound that has high saturation and is excellent in light resistance can be obtained. Furthermore, according to the present invention, an ink, a heat-sensitive transfer recording sheet and a resist composition for a color filter all of which have high saturation and are excellent in light resistance can be obtained.

Further features of the present invention will become apparent from the following description of exemplary embodiments with reference to the attached drawings.

BRIEF DESCRIPTION OF THE DRAWINGS

FIG. 1 is a diagram of a $^1$H NMR spectrum of a compound (1) of the present invention represented by the general formula (1) obtained in $CDCl_3$ at room temperature at 400 MHz.

DESCRIPTION OF THE EMBODIMENTS

Preferred embodiments of the present invention will now be described in detail in accordance with the accompanying drawings.

The present invention will now be described in more details.

The present inventors made earnest examination for overcoming the aforementioned problems, resulting in finding that a coloring matter compound having a structure represented by the following general formula (1) has high saturation and is excellent in light resistance.

The present inventors also found that the coloring matter compound can be used for obtaining an ink, a heat-sensitive transfer recording sheet and a resist composition for a color filter all of which have high saturation and are excellent in light resistance, and thus, the present invention was accomplished.

General formula (1)

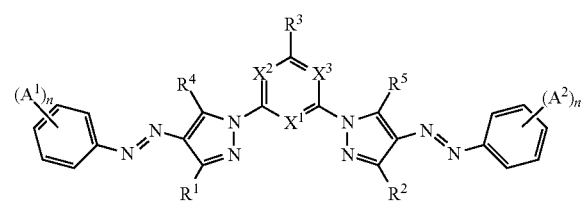

wherein $R^1$ and $R^2$ each independently represent a hydrogen atom, an alkyl group or an aryl group, $R^3$ represents a hydrogen atom, an alkyl group, an aryl group, an alkoxy group or a hydroxy group, $R^4$ and $R^5$ each independently represent a hydrogen atom or an amino group, $X^1$ to $X^3$ each independently represent a carbon atom or a nitrogen atom, $A^1$ and $A^2$ each independently represent a hydrogen atom, an alkyl group, an alkoxy group, an aryl group, a carbamoyl group, a carboxylic acid ester group, a carboxylic acid amide group, a sulfonic acid ester group, a sulfonic acid amide group, a trifluoromethyl group, a cyano group, a hydroxy group, a nitro group, an amino group or a halogen atom, and n represents an integer of 1 to 5.

First, the coloring matter compound represented by the formula (1) will be described.

$R^1$ and $R^2$ of the formula (1) each independently represent a hydrogen atom, an alkyl group or an aryl group.

The alkyl group as $R^1$ or $R^2$ of the general formula (1) is not especially limited, but examples include primary, secondary or tertiary, saturated or unsaturated, straight-chain, branched or cyclic alkyl groups having 1 to 20 carbon atoms, such as a methyl group, an ethyl group, an n-propyl group, an iso-propyl group, an n-butyl group, a sec-butyl group, a tert-butyl group, an octyl group, a dodecyl group, a nonadecyl group, a cyclobutyl group, a cyclopentyl group, a cyclohexyl group, a methyl cyclohexyl group, a 2-ethylpropyl group, a 2-ethylhexyl group, and a cyclohexenylethyl group.

The aryl group as $R^1$ and $R^2$ of the general formula (1) is not especially limited, but examples include a phenyl group, a methyl phenyl group and a dimethyl phenyl group.

$R^3$ of the general formula (1) represents a hydrogen atom, an alkyl group, an aryl group, an alkoxy group or a hydroxy group.

The alkyl group as $R^3$ of the general formula (1) is not especially limited, but examples include primary, secondary or tertiary, saturated or unsaturated, straight-chain, branched or cyclic alkyl groups having 1 to 20 carbon atoms, such as a methyl group, an ethyl group, an n-propyl group, an iso-propyl group, an n-butyl group, a sec-butyl group, a tert-butyl group, an octyl group, a dodecyl group, a nonadecyl group, a cyclobutyl group, a cyclopentyl group, a cyclohexyl group, a methyl cyclohexyl group, a 2-ethylpropyl group, a 2-ethylhexyl group, and a cyclohexenylethyl group.

The aryl group as $R^3$ of the general formula (1) is not especially limited, but examples include a phenyl group, a methyl phenyl group and a dimethyl phenyl group.

The alkoxy group as $R^3$ of the general formula (1) is not especially limited, but examples include a methoxy group, an ethoxy group, a propoxy group and a butoxy group.

$R^4$ and $R^5$ of the general formula (1) each independently represent a hydrogen atom or an amino group.

The amino group as $R^4$ and $R^5$ of the general formula (1) is not especially limited, but examples include, in addition to an amino group, di-substituted amino groups, such as a dimethyl amino group, a diethyl amino group and a di(ethylhexyl) amino group; and mono-substituted amino groups such as an acyl amino group, a diacyl amino group and a benzoyl amino group.

$X^1$ to $X^3$ of the general formula (1) each independently represent a carbon atom or a nitrogen atom.

In other words, in the general formula (1), a six-membered ring formed by $X^1$ to $X^3$ and three carbon atoms is any one of a benzene ring, a pyridine ring, a pyrimidine ring and a triazine ring.

In particular, the following combinations of $X^1$ to $X^3$ can be suitably employed from the viewpoint of further improving the saturation and the light resistance of the coloring matter compound:

A combination in which $X^1$ represents a carbon atom with $X^2$ and $X^3$ each representing a nitrogen atom; and a combination in which $X^1$, $X^2$ and $X^3$ each represent a nitrogen atom.

$A^1$ and $A^2$ of the general formula (1) each independently represent an alkyl group, an alkoxy group, an aryl group, a carbamoyl group, a carboxylic acid ester group, a carboxylic acid amide group, a sulfonic acid ester group, a sulfonic acid amide group, a cyano group, a hydroxy group, a nitro group, an amino group or a halogen atom.

The alkyl group as $A^1$ and $A^2$ of the general formula (1) is not especially limited, but examples include primary, secondary or tertiary, saturated or unsaturated, straight-chain, branched or cyclic alkyl groups having 1 to 20 carbon atoms, such as a methyl group, an ethyl group, an n-propyl group, an iso-propyl group, an n-butyl group, a sec-butyl group, a tert-butyl group, an octyl group, a dodecyl group, a nonadecyl group, a cyclobutyl group, a cyclopentyl group, a cyclohexyl group, a methyl cyclohexyl group, a 2-ethylpropyl group, a 2-ethylhexyl group, and a cyclohexenylethyl group.

The alkoxy group as $A^1$ and $A^2$ of the general formula (1) is not especially limited, but examples include a methoxy group, an ethoxy group, a propoxy group and a butoxy group.

The aryl group as $A^1$ and $A^2$ of the general formula (1) is not especially limited, but examples include a phenyl group, a methyl phenyl group and a dimethyl phenyl group.

The carboxylic acid ester group as $A^1$ and $A^2$ of the general formula (1) is not especially limited, but examples include a carboxylic acid methyl ester group, a carboxylic acid ethyl ester group, a carboxylic acid butyl ester group, and a carboxylic acid ethylhexyl ester group.

The carboxylic acid amide group as $A^1$ and $A^2$ of the general formula (1) is not especially limited, but examples include carboxylic acid dialkyl amide groups such as a carboxylic acid dimethyl amide group, a carboxylic acid diethyl amide group, and a carboxylic acid di(ethylhexyl) amide group; and carboxylic acid monoalkyl amide groups such as a carboxylic acid methyl amide group, a carboxylic acid ethyl amide group, and a carboxylic acid ethylhexyl amide group.

The sulfonic acid ester group as $A^1$ and $A^2$ of the general formula (1) is not especially limited, but examples include a sulfonic acid methyl ester group, a sulfonic acid ethyl ester group, a sulfonic acid propyl ester group, and a sulfonic acid butyl ester group.

Examples of the sulfonic acid amide group as $A^1$ and $A^2$ of the general formula (1) include sulfonic acid dialkyl amide groups such as a sulfonic acid dimethyl amide group and a sulfonic acid diethyl amide group; and sulfonic acid monoalkyl amide groups such as a sulfonic acid methyl amide group, a sulfonic acid ethyl amide group, and a sulfonic acid ethylhexyl amide group.

The amino group as $A^1$ and $A^2$ of the general formula (1) is not especially limited, but examples include, in addition to an amino group, di-substituted amino groups, such as a dimethyl amino group, a diethyl amino group and a di(ethylhexyl) amino group; and mono-substituted amino groups such as an acyl amino group, a diacyl amino group and a benzoyl amino group.

The halogen atom as $A^1$ and $A^2$ of the general formula (1) is not especially limited, but examples include a fluorine atom, a chlorine atom, a bromine atom and an iodine atom.

In the general formula (1), one of or both of $A^1$ and $A^2$ can be particularly a carboxylic acid ester group, a carboxylic acid amide group, a sulfonic acid ester group or a sulfonic acid amide group. Thus, the saturation and the light resistance of the coloring matter compound represented by the general formula (1) can be further improved.

In the general formula (1), n represents an integer of 1 to 5. Thus, an arbitrary number, ranging from 1 to 5, of substituents can be introduced into an arbitrary portion.

The coloring matter compound represented by the general formula (1) can be synthesized by a known method or the like described in, for example, Journal of Imaging Science and Technology, Volume 55, Number 2, 1 March 2011, pp. 20504-1 to 20504-6(6).

As the coloring matter compound represented by the general formula (1), one of such compounds may be singly used, or two or more of the compounds may be used in combination with the color tone, the saturation and the like adjusted according to the purpose of application. Furthermore, two or more of known pigments or dyes may be used together.

Specific preferable examples of the coloring matter compound of the present invention include, but are not limited to, the following coloring matter compounds (1) to (45):

Compound (1)

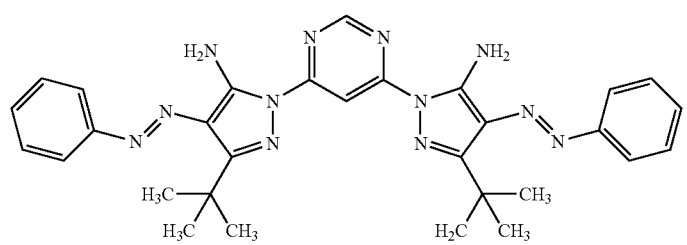

Compound (2)

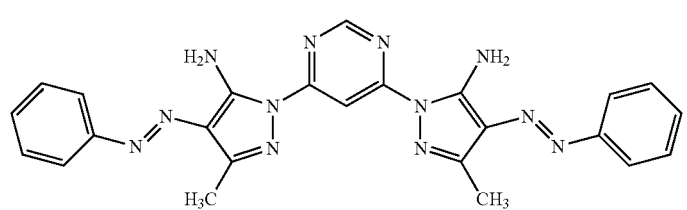

Compound (3)

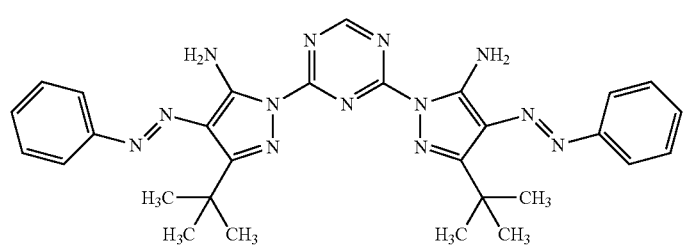

Compound (4)
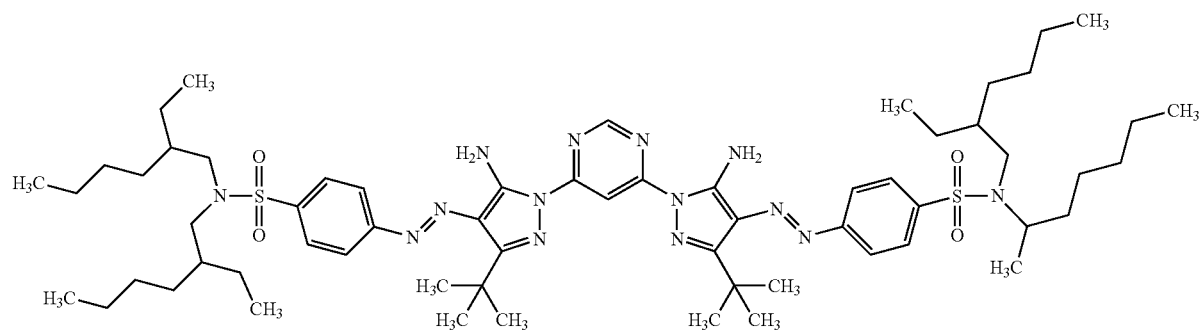
Compound (5)
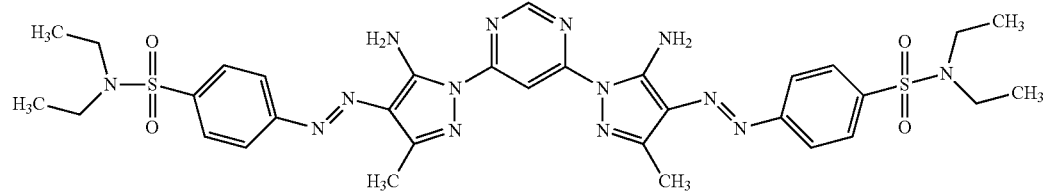
Compound (6)
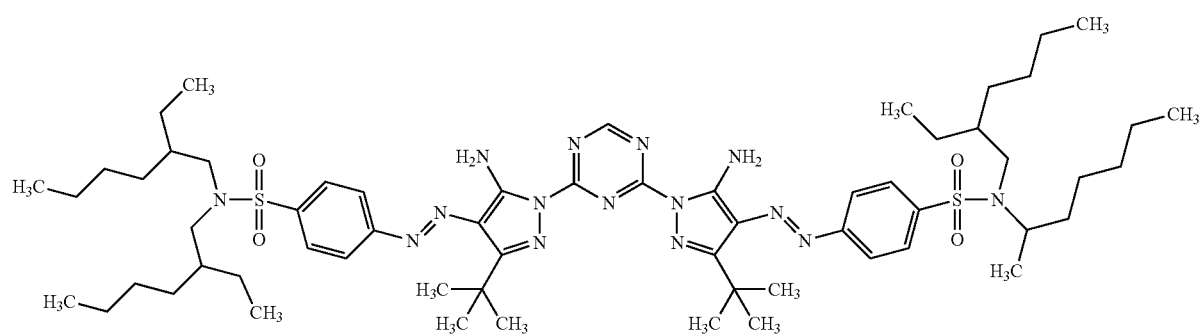
Compound (7)
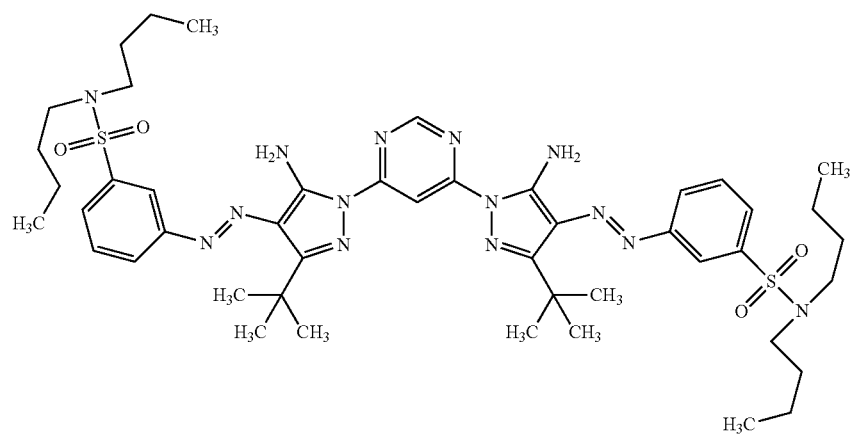

-continued
Compound (8)
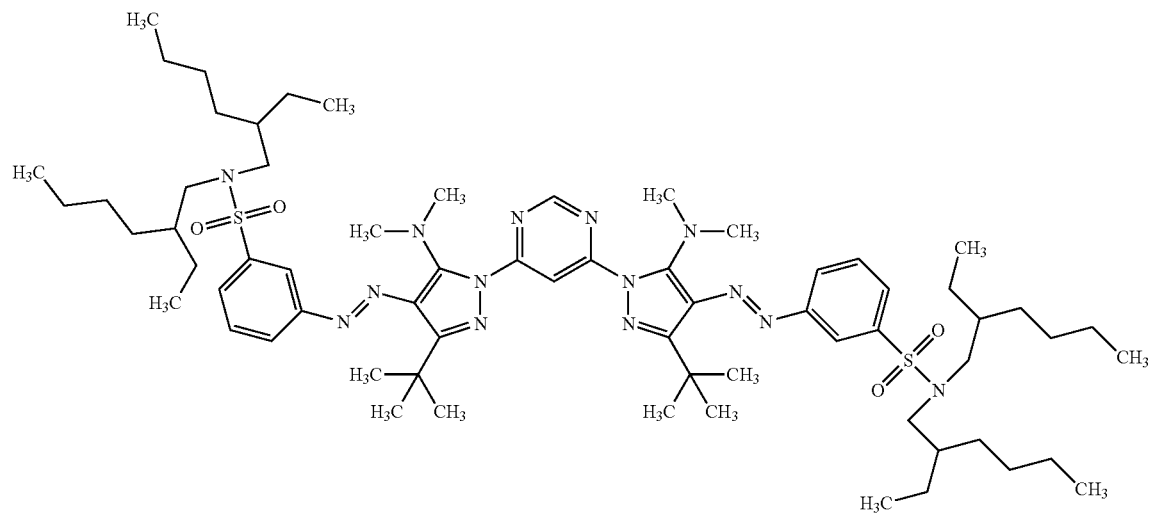
Compound (9)
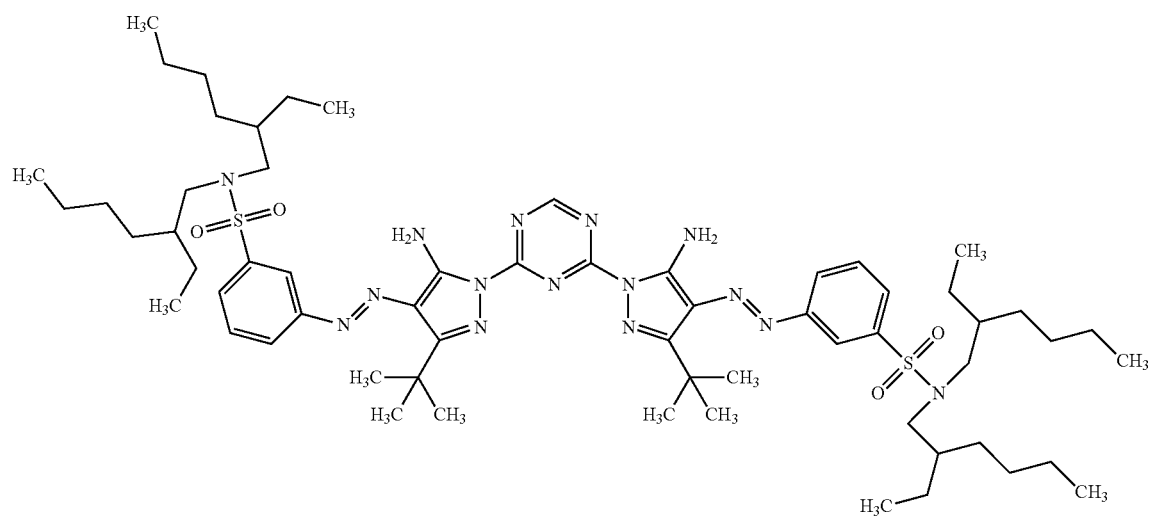
Compound (10)
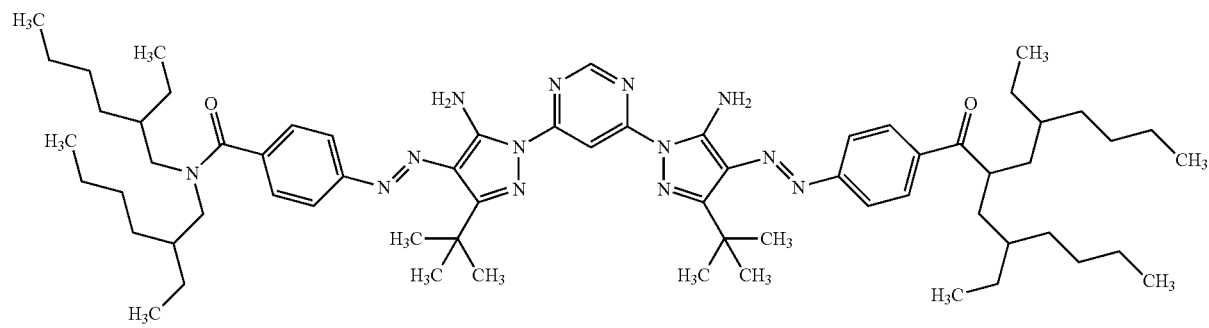

-continued
Compound (11)
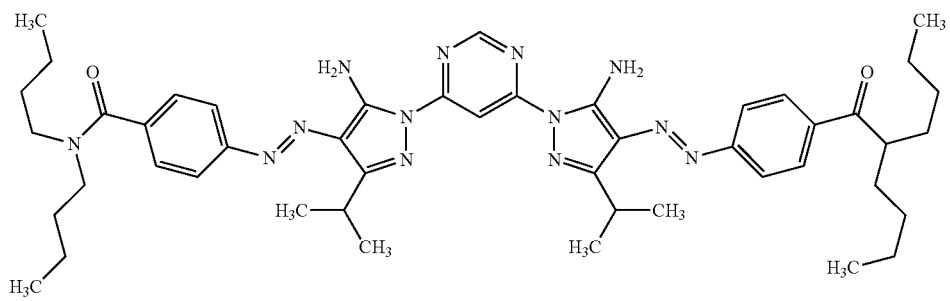
Compound (12)
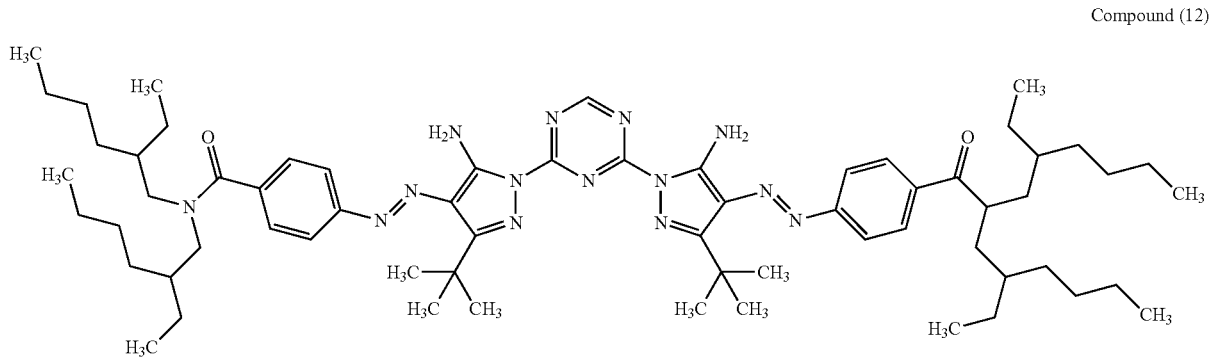
Compound (13)
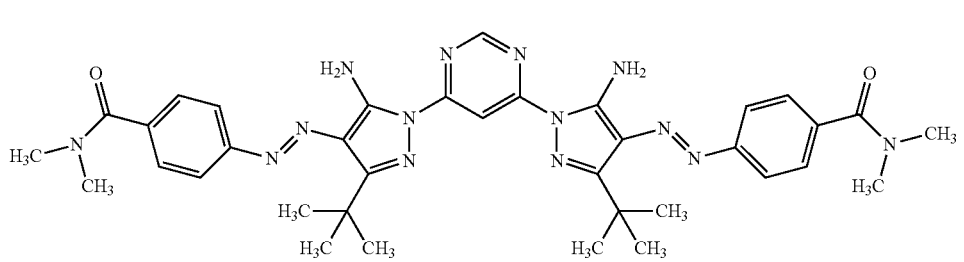
Compound (14)
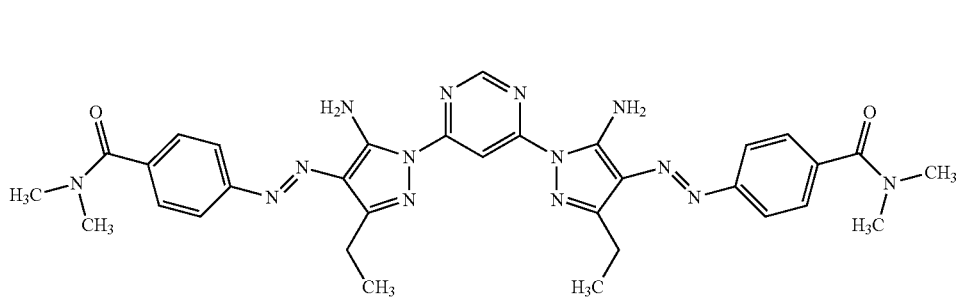
Compound (15)
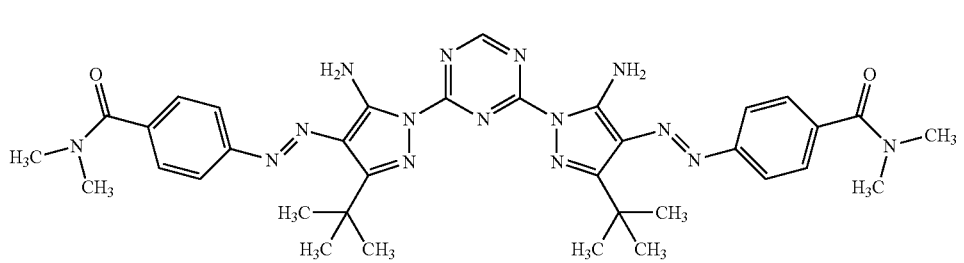

-continued
Compound (16)
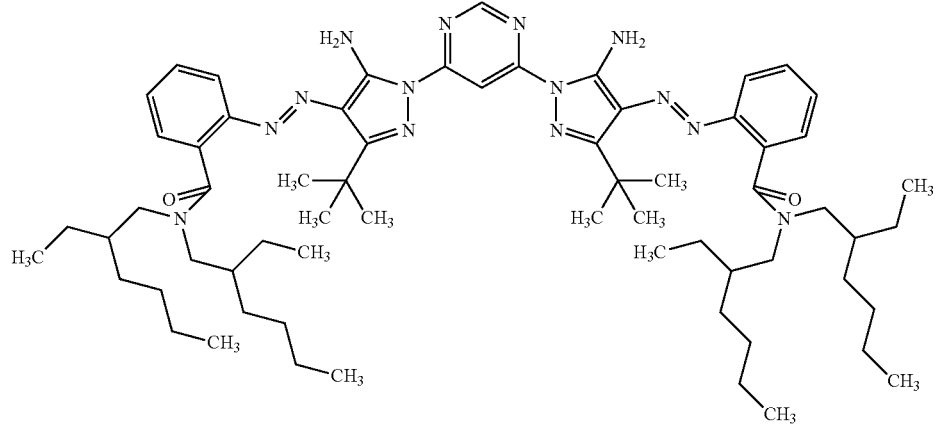
Compound (17)
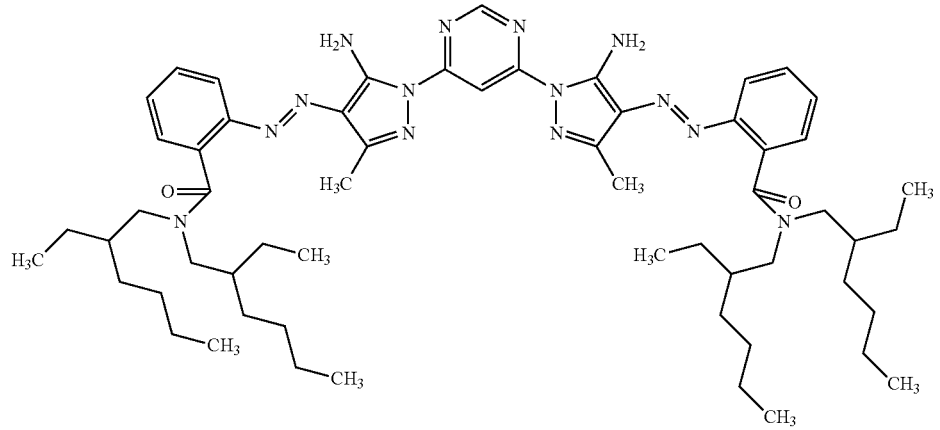
Compound (18)
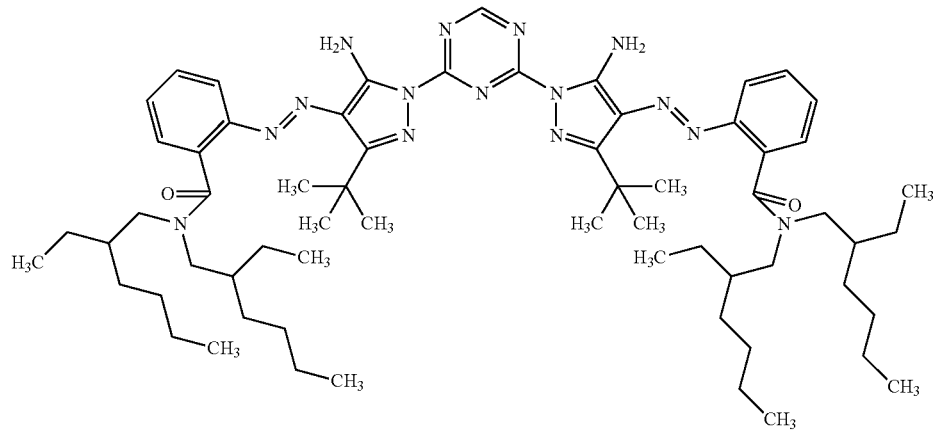
Compound (19)
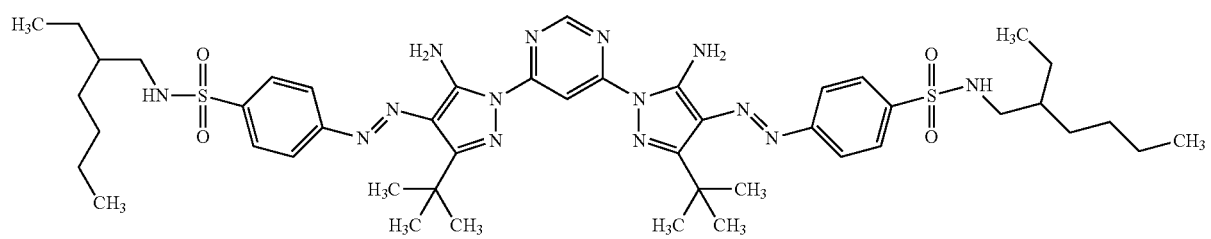

Compound (20)
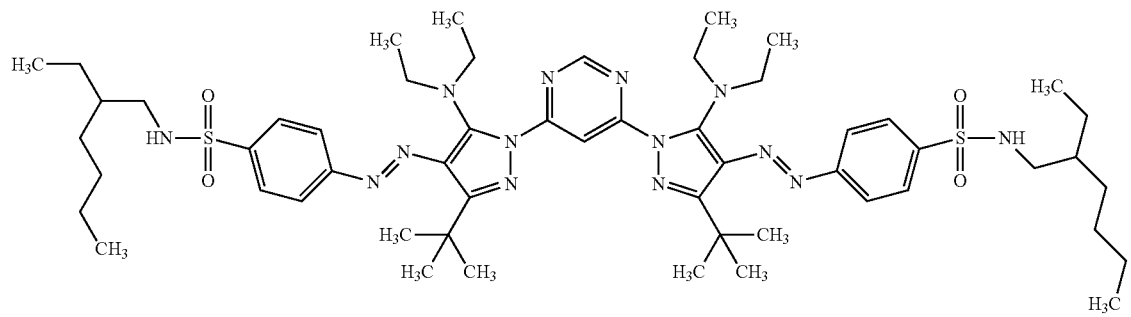
Compound (21)
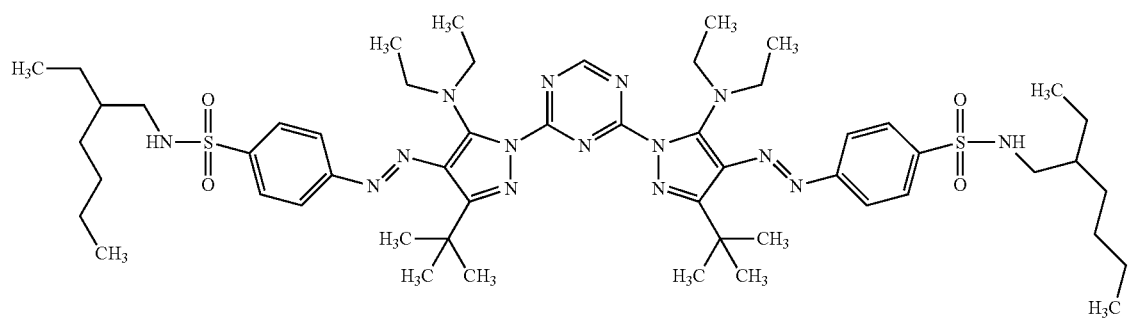
Compound (22)
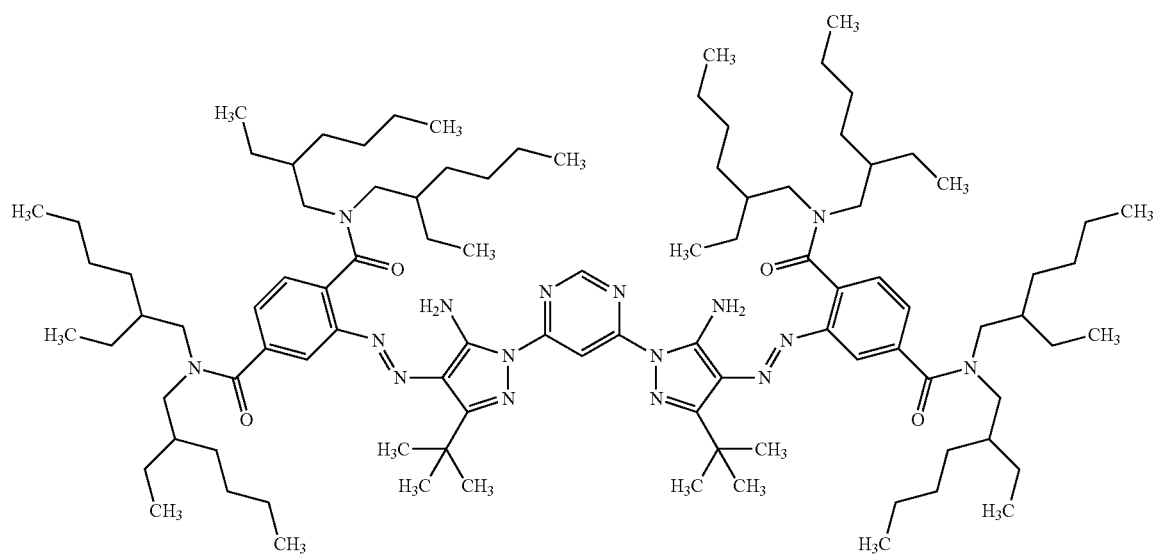

-continued
Compound (23)
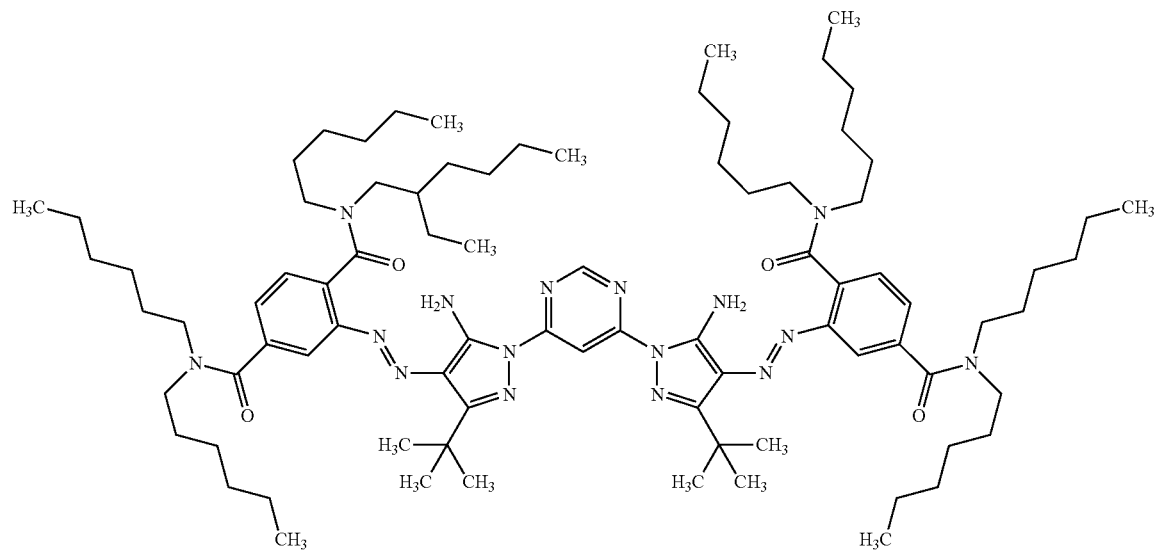
Compound (24)
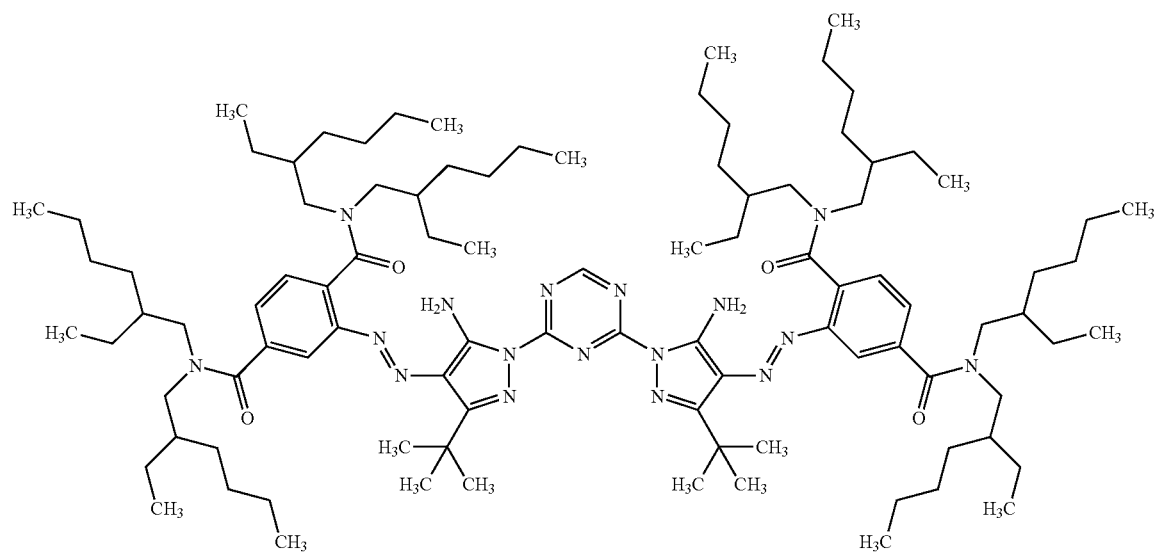
Compound (25)
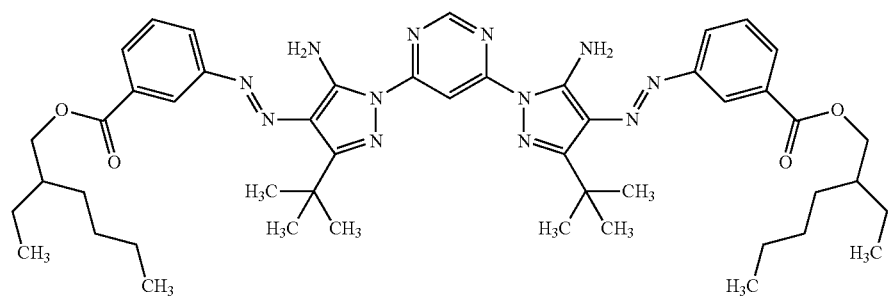

Compound (26)
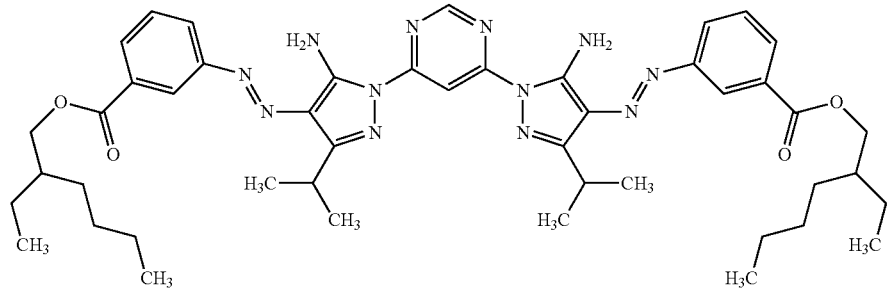
Compound (27)
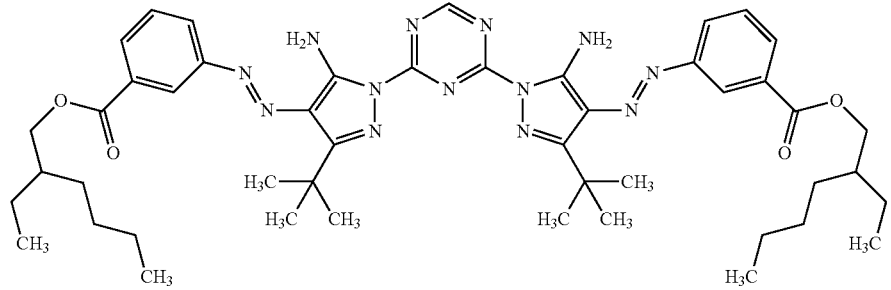
Compound (28)
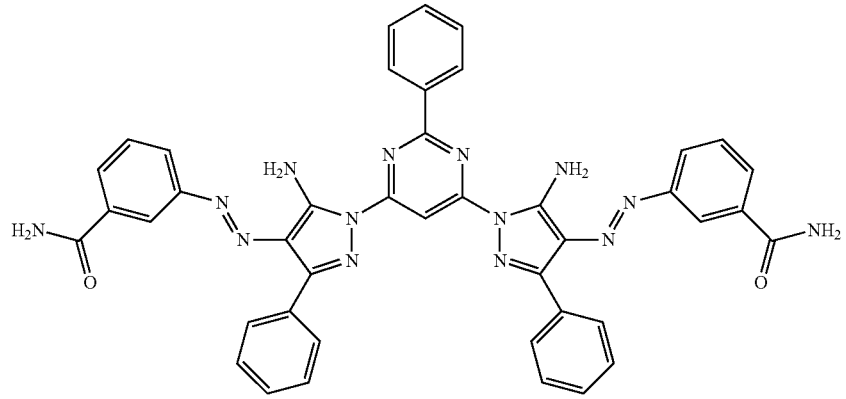
Compound (29)
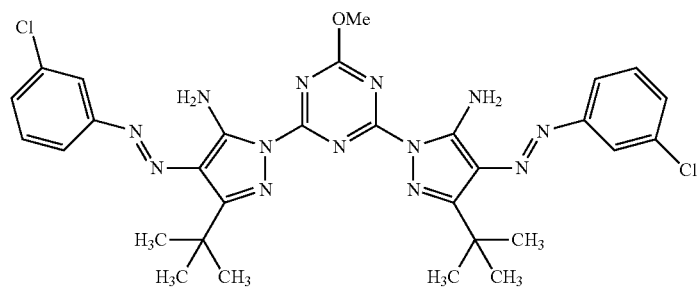
Compound (30)
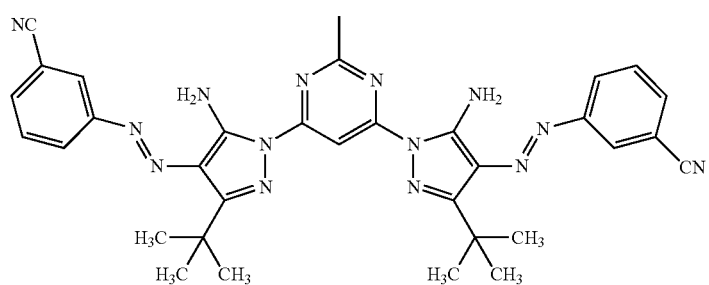

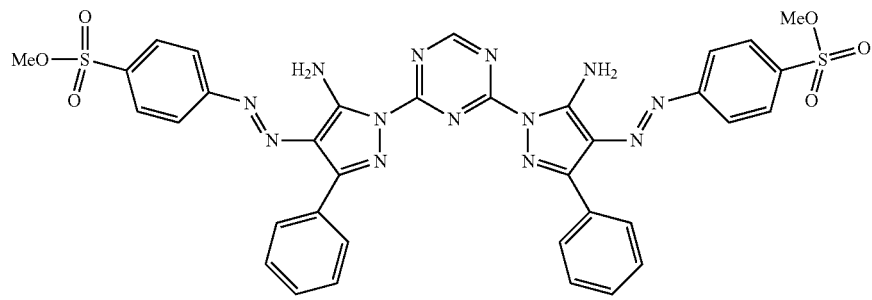
Compound (31)
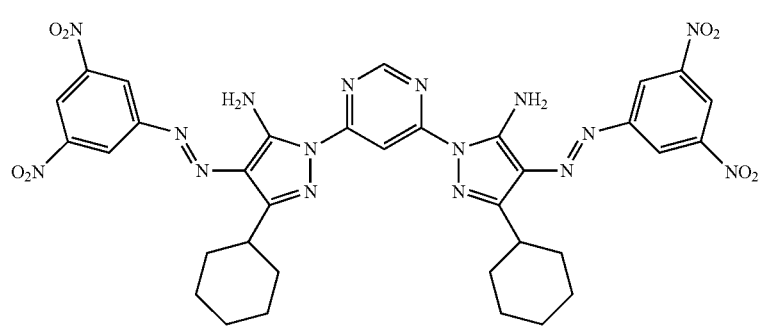
Compound (32)
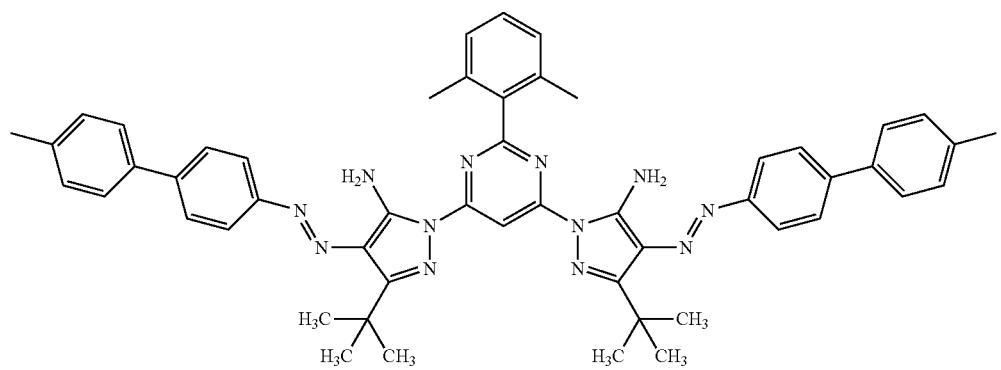
Compound (33)
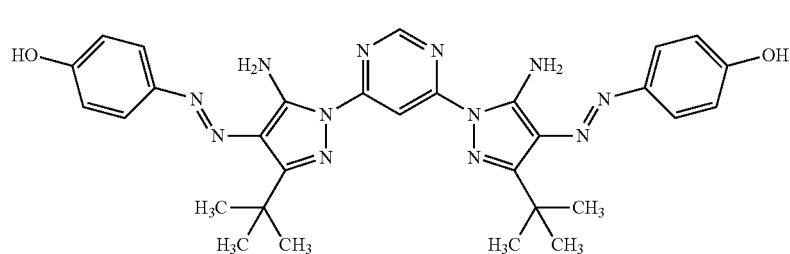
Compound (34)
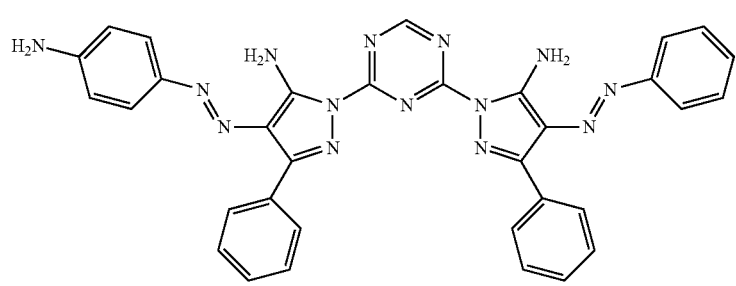
Compound (35)

Compound (36)
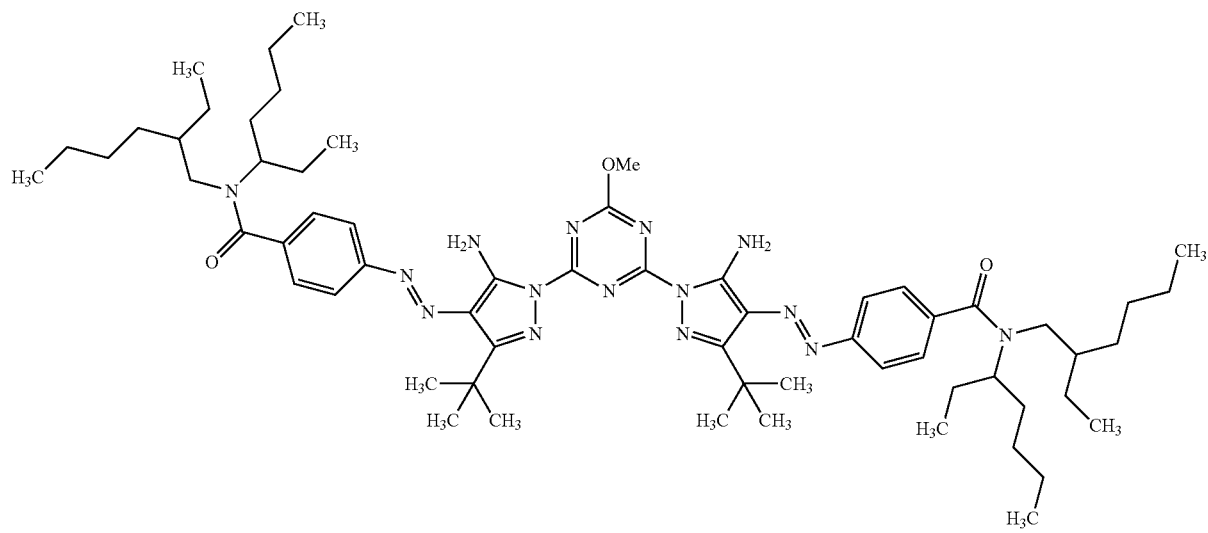
Compound (37)
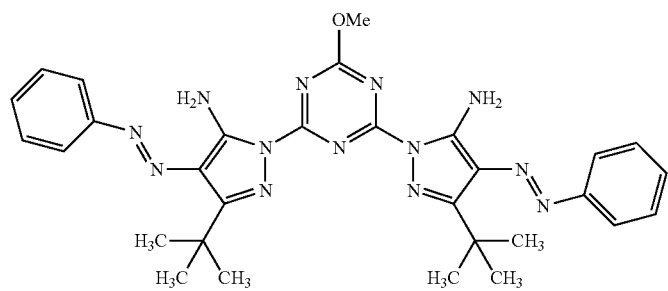
Compound (38)
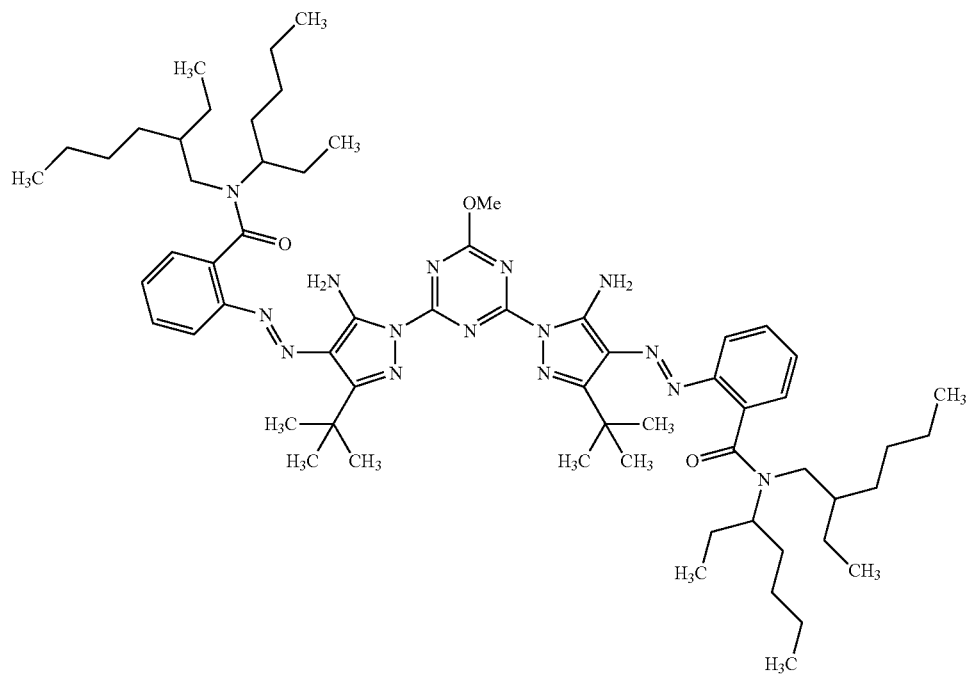

-continued
Compound (39)
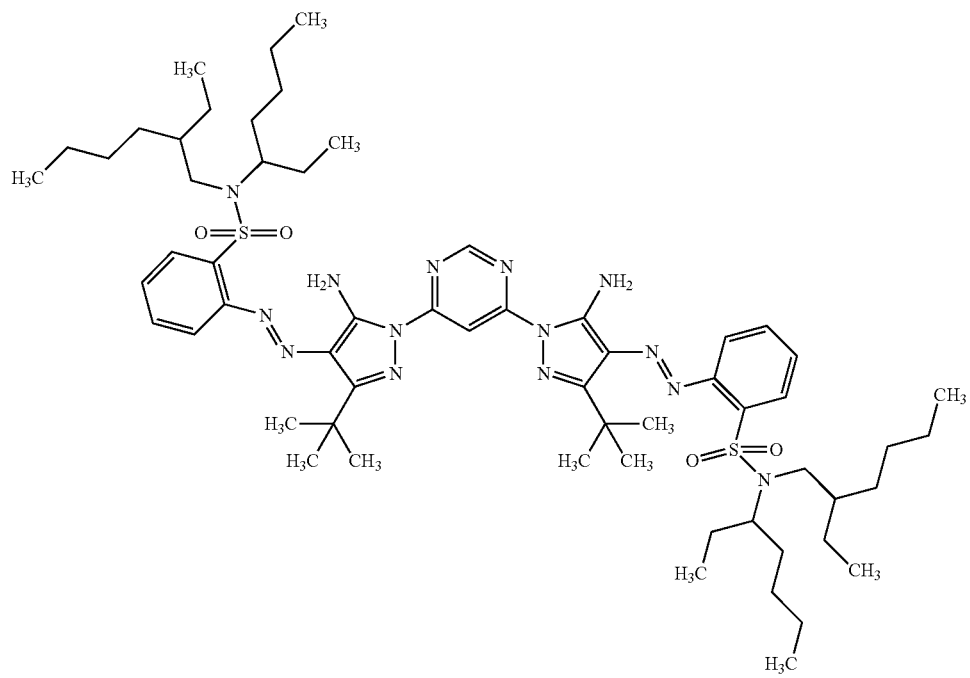
Compound (40)
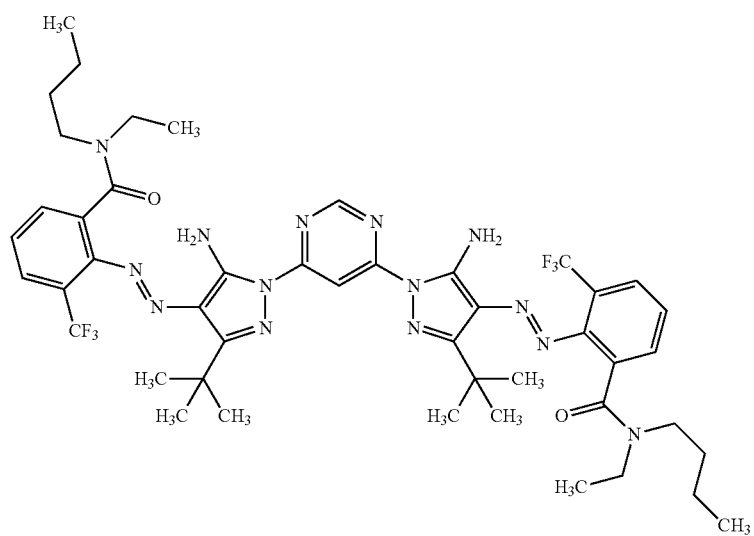

Compound (41)
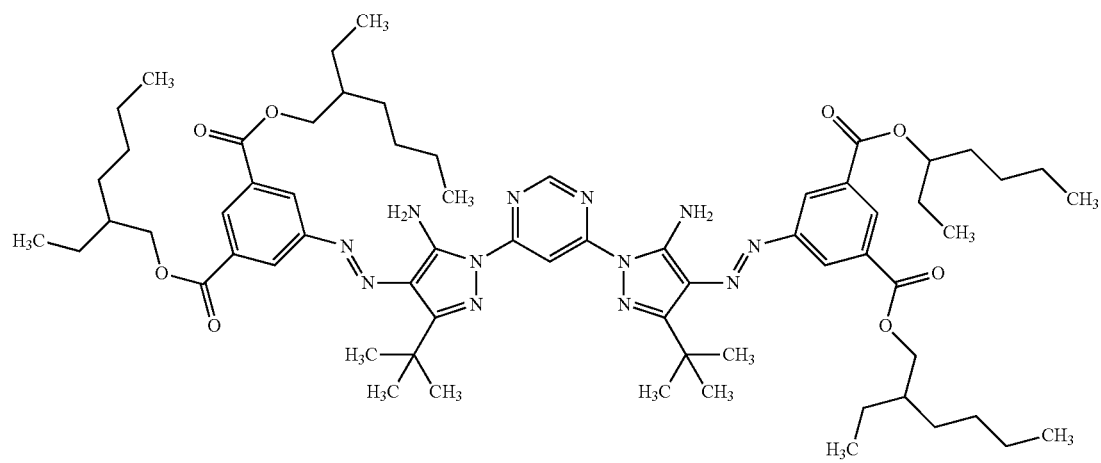
Compound (42)
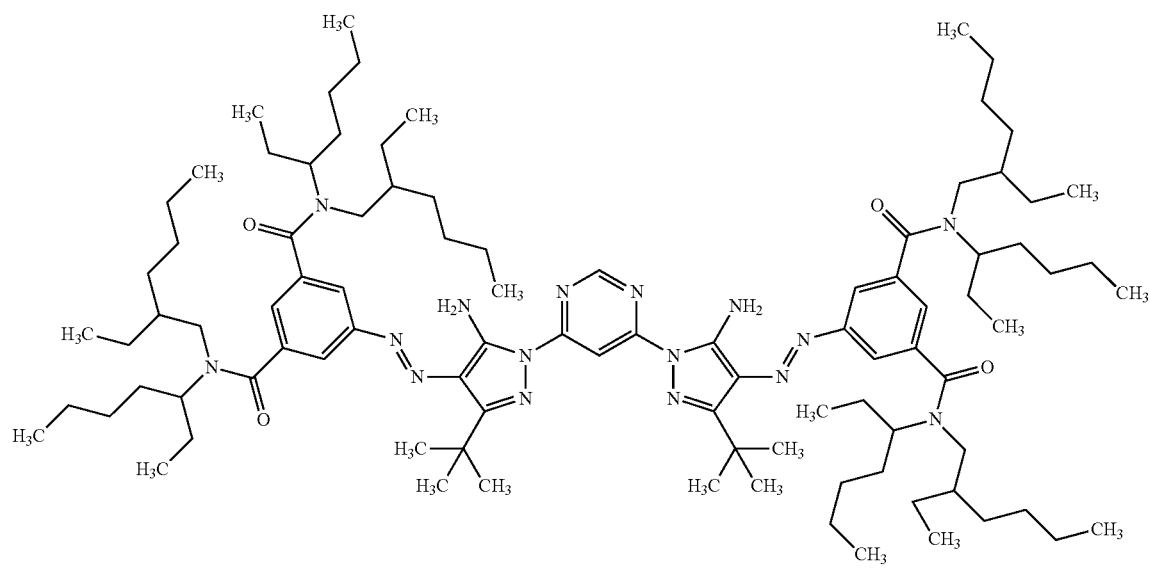
Compound (43)
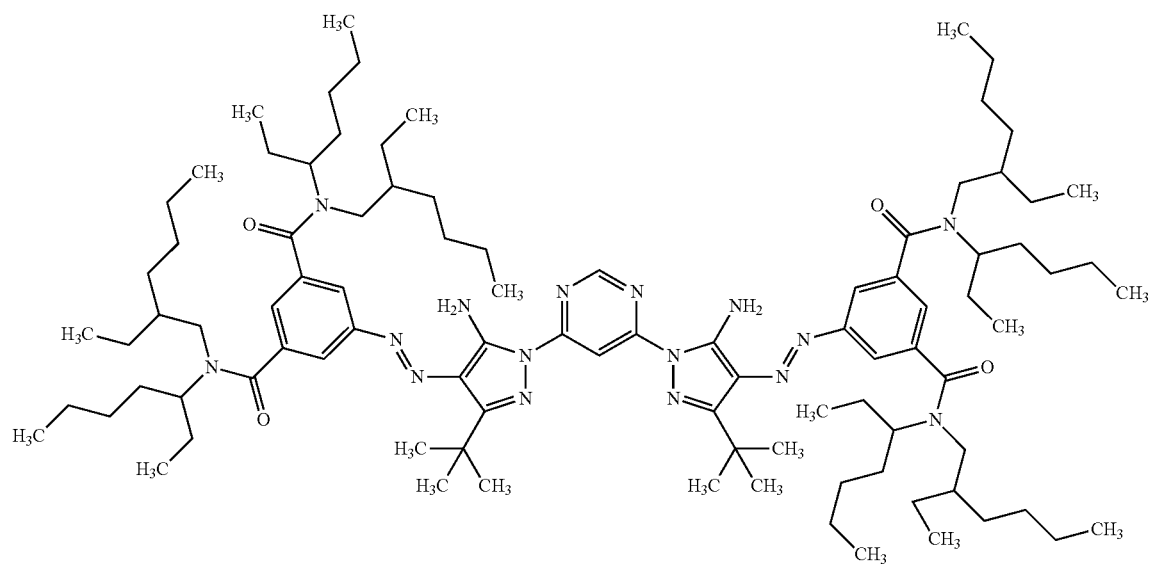

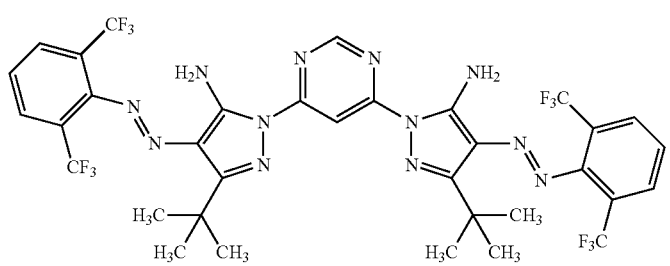

Compound (44)

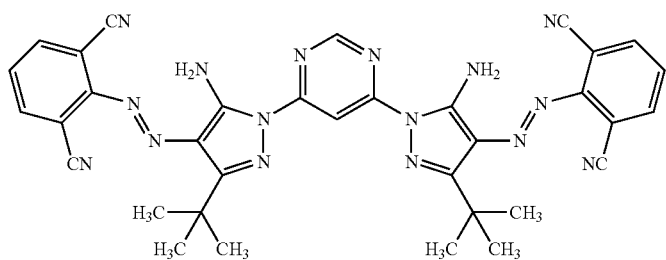

Compound (45)

<Ink>

The ink according to the present invention will now be described.

Since the coloring matter compound having a structure represented by the general formula (1) has high saturation and shows excellent light resistance, the compound can be suitably used as a coloring agent for an ink. The ink according to the present invention is an ink containing a medium and the coloring matter compound having a structure represented by the general formula (1).

In the ink according to the present invention, components other than the above can be individually determined according to the application of the ink of the present invention, and additives may be appropriately added as long as properties for various applications of the ink are not impeded.

Furthermore, the ink of the present invention can be suitably used not only as an inkjet ink but also as a printing ink, a coating material or an ink for a writing tool. In particular, the ink of the present invention can be suitably used as an ink for a resist for a color filter or for a heat-sensitive transfer recording sheet described later.

The ink of the present invention is obtained as follows:

The coloring matter compound of the present invention is gradually added to a medium with stirring, if necessary, together with another coloring agent, an emulsifier or a resin, so as to be sufficiently mixed with the medium. Furthermore, the compound is stably dissolved or finely dispersed by applying mechanical shearing force with a disperser, and thus, an ink of the present invention can be obtained.

The "medium" herein means water or an organic solvent.

If an organic solvent is used as the "medium", the kind of organic solvent is not especially limited but can be appropriately determined according to the application of the coloring agent.

Specific examples include: alcohols such as methanol, ethanol, denatured ethanol, isopropanol, n-butanol, isobutanol, tert-butanol, sec-butanol, 2-methyl-2-butanol, 3-pentanol, octanol, benzyl alcohol, and cyclohexanol; glycols such as methyl cellosolve, ethyl cellosolve, diethylene glycol, and diethylene glycol monobutyl ether; ketones such as acetone, methyl ethyl ketone, and methyl isobutyl ketone; esters such as ethyl acetate, butyl acetate, ethyl propionate, and cellosolve acetate; aliphatic hydrocarbons such as hexane, octane, petroleum ether, and cyclohexane; aromatic hydrocarbons such as benzene, toluene, and xylene; halogenated hydrocarbons such as carbon tetrachloride, trichloroethylene, and tetrabromoethane; ethers such as diethyl ether, dimethyl glycol, trioxane, and tetrahydrofuran; acetals such as methylal and diethyl acetal; organic acids such as formic acid, acetic acid and propionic acid; and sulfur- or nitrogen-containing organic compounds such as nitrobenzene, dimethyl amine, monoethanol amine, pyridine, dimethyl sulfoxide, and dimethylformamide.

Alternatively, a polymerizable monomer can be used as the organic solvent. The polymerizable monomer is an addition polymerizable monomer or a condensation polymerizable monomer, and can be an addition polymerizable monomer.

Examples of such polymerizable monomers include styrene monomers, acrylate monomers, methacrylate monomers, olefin monomers, halogenated vinyl monomers, vinyl ether monomers and vinyl ketone monomers.

Specific examples of the styrene monomers include styrene, α-methyl styrene, α-ethyl styrene, o-methyl styrene, m-methyl styrene, p-methyl styrene, o-ethyl styrene, m-ethyl styrene and p-ethyl styrene.

Specific examples of the acrylate monomers include methyl acrylate, ethyl acrylate, propyl acrylate, butyl acrylate, octyl acrylate, dodecyl acrylate, stearyl acrylate, behenyl acrylate, 2-ethylhexyl acrylate, dimethyl amino ethyl acrylate, diethyl amino ethyl acrylate, acrylonitrile and acrylic acid amide.

Specific examples of the methacrylate monomers include methyl methacrylate, ethyl methacrylate, propyl methacrylate, butyl methacrylate, octyl methacrylate, dodecyl methacrylate, stearyl methacrylate, behenyl methacrylate, 2-ethylhexyl methacrylate, dimethyl amino ethyl methacrylate, diethyl amino ethyl methacrylate, methacrylonitrile and methacrylic acid amide.

Specific examples of the olefin monomers include ethylene, propylene, butylene, butadiene, isoprene, isobutylene and cyclohexene.

Specific examples of the halogenated vinyl monomers include vinyl chloride, vinylidene chloride, vinyl bromide and vinyl iodide.

Specific examples of the vinyl ester monomers include vinyl acetate, vinyl propionate and vinyl benzoate.

Specific examples of the vinyl ether monomers include vinyl methyl ether, vinyl ethyl ether and vinyl isobutyl ether.

Specific examples of the vinyl ketone monomers include vinyl methyl ketone, vinyl hexyl ketone and methyl isopropenyl ketone.

One of these various polymerizable monomers can be singly used. Alternatively, two or more of the monomers can be used in combination.

As the coloring agent for the ink of the present invention, a second coloring agent other than the coloring matter compound having a structure represented by the general formula (1) may be used. The second coloring agent is not especially limited as long as the solubility or the dispersibility, in the medium, of the coloring matter compound having a structure represented by the general formula (1) is not impeded.

Specific examples of the second coloring agent usable together include: C.I. Solvent Yellow 1, 19, 44, 49, 62, 74, 77, 79, 81, 82, 83, 89, 90, 93, 98, 103, 104, 112, 120, 121, 151, 153, 154 and 162; C.I. Pigment Yellow 1, 2, 3, 4, 5, 6, 7, 10, 11, 12, 13, 14, 15, 17, 23, 62, 65, 73, 74, 81, 83, 93, 94, 95, 97, 98, 109, 110, 111, 117, 120, 127, 128, 129, 137, 138, 139, 147, 150, 151, 154, 155, 167, 168, 173, 174, 176, 180, 181, 183 and 191; and derivatives thereof.

The content of the coloring agent in the ink of the present invention is preferably 1.0 part by mass to 30 parts by mass, more preferably 2.0 parts by mass to 20 parts by mass, and further more preferably 3.0 parts by mass to 15 parts by mass based on 100 parts by mass of the medium. When the content falls in the aforementioned range, the dispersibility of the coloring agent is good while attaining sufficient coloring power.

If water is used as the medium of the ink of the present invention, an emulsifier may be added if necessary for attaining good dispersion stability of the coloring agent. The emulsifier that can be added is not especially limited, and examples include a cationic surfactant, an anionic surfactant and a nonionic surfactant.

Examples of the cationic surfactant include dodecyl ammonium chloride, dodecyl ammonium bromide, dodecyl trimethyl ammonium bromide, dodecyl pyridinium chloride, dodecyl pyridinium bromide, and hexadecyl trimethyl ammonium bromide.

Examples of the anionic surfactant include fatty acid soap such as sodium stearate and sodium dodecanoate; sodium dodecyl sulfate, sodium dodecylbenzene sulfate, and sodium lauryl sulfate.

Examples of the nonionic surfactant include dodecyl polyoxyethylene ether, hexadecyl polyoxyethylene ether, nonylphenyl polyoxyethylene ether, lauryl polyoxyethylene ether, sorbitan monooleate polyoxyethylene ether, and monodecanoyl sucrose.

The ink of the present invention may further contain a resin. The type of resin that may be contained in the ink of the present invention is not especially limited but can be appropriately selected according to the application. Specific examples of the resin include a polystyrene resin, a styrene copolymer, a polyacrylic acid resin, a polymethacrylic acid resin, a polyacrylate resin, a polymethacrylate resin, an acrylic acid copolymer, a methacrylic acid copolymer, a polyester resin, a polyvinyl ether resin, a polyvinyl methyl ether resin, a polyvinyl alcohol resin, a polyvinyl butyral resin, a polyurethane resin and a polypeptide resin. One of these resins may be singly used, or two or more of these resins may be used in combination if necessary.

The disperser used in the preparation of the ink is not especially limited, and a media type disperser such as a rotary shearing homogenizer, a ball mill, a sand mill or an attritor, or a high-pressure counter collision disperser can be used.

As described so far, since the ink of the present invention contains the coloring matter compound of the present invention, an ink having high saturation and high light resistance can be provided.

<Heat-Sensitive Transfer Recording Sheet>

Next, the heat-sensitive transfer recording sheet of the present invention will be described.

The coloring matter compound having high saturation and high light resistance of the present invention can be suitably used for a heat-sensitive transfer recording sheet.

The heat-sensitive transfer recording sheet of the present invention includes: a substrate; and a coloring material layer obtained by forming, on the substrate, a film of a composition containing the coloring matter compound of the present invention.

The heat-sensitive transfer recording sheet of the present invention is obtained as follows: A coloring agent containing a coloring matter compound having a structure represented by the general formula (1), a binding resin, and a surfactant and a wax if necessary, are gradually added to a medium with stirring, so as to be sufficiently mixed with the medium. Furthermore, the composition is stably dissolved or finely dispersed by applying mechanical shearing force with a disperser, and thus, an ink of the present invention is prepared. Next, the ink is applied on a base film used as a substrate and then dried, and thus, a heat-sensitive transfer recording sheet of the present invention can be prepared. Incidentally, the heat-sensitive transfer recording sheet of the present invention may contain the coloring matter compound having a structure represented by the general formula (1), and hence, the heat-sensitive transfer recording sheet of the present invention is not limited to one obtained by this preparation method.

Various resins may be used as the binding resin for the heat-sensitive transfer recording sheet of the present invention. In particular, water soluble resins such as a cellulose resin, a polyacrylic acid resin, a starch resin and an epoxy resin; and organic solvent soluble resins such as a polyacrylate resin, a polymethacrylate resin, a polystyrene resin, a polycarbonate resin, a polyether sulfone resin, a polyvinyl butyral resin, an ethyl cellulose resin, an acetyl cellulose resin, a polyester resin, an AS resin, and a phenoxy resin can be suitably used. One of these resins may be singly used, or two or more of these may be used in combination as occasion demands.

As the medium usable in the aforementioned preparation method, those usable as the medium of the ink can be used. Specifically, water or an organic solvent can be used. As the organic solvent, alcohols such as methanol, ethanol, isopropanol, and isobutanol; cellosolves such as methyl cellosolve and ethyl cellosolve; aromatic hydrocarbons such as toluene, xylene and chlorobenzene; esters such as ethyl acetate and butyl acetate; ketones such as acetone, methyl ethyl ketone, methyl isobutyl ketone, and cyclohexanone; halogenated hydrocarbons such as methylene chloride, chloroform and trichloroethylene; ethers such as tetrahydrofuran and dioxane; and N,N-dimethylformamide and N-methylpyrrolidone can be suitably used. One of these organic solvents may be singly used, or two or more of these may be used in combination if necessary.

In the heat-sensitive transfer recording sheet of the present invention, the coloring matter compound having a structure represented by the general formula (1) is used as a coloring agent, and therefore, a heat-sensitive transfer recording sheet excellent in saturation and light resistance can be obtained. Furthermore, a second coloring agent may be used together for purpose of color matching, so as to attain desired spectral properties. The coloring agent that can be used together is not especially limited as long as the brightness, the saturation and the light resistance of the heat-sensitive transfer recording sheet of the present invention are not largely affected, and examples include: C.I. Solvent Yellow 1, 19, 44, 49, 62, 74, 77, 79, 81, 82, 83, 89, 90, 93, 98, 103, 104, 112, 120, 121, 151, 153, 154, 162 and various coloring agents classified as derivatives of these.

The ratio of the used binding resin to coloring agent (binding resin: coloring agent) can be 1:2 to 2:1 in a mass ratio from the viewpoint of transferrability.

The heat-sensitive transfer recording sheet of the present invention may contain a surfactant so as to attain sufficient lubricity at the time when heated with a thermal head (at the time of printing). Examples of the surfactant that can be contained include a cationic surfactant, an anionic surfactant and a nonionic surfactant.

Examples of the cationic surfactant include dodecyl ammonium chloride, dodecyl ammonium bromide, dodecyl trimethyl ammonium bromide, dodecyl pyridinium chloride, dodecyl pyridinium bromide, and hexadecyl trimethyl ammonium bromide.

Examples of the anionic surfactant include fatty acid soap such as sodium stearate and sodium dodecanoate; sodium dodecyl sulfate, sodium dodecylbenzene sulfate, and sodium lauryl sulfate.

Examples of the nonionic surfactant include dodecyl polyoxyethylene ether, hexadecyl polyoxyethylene ether, nonylphenyl polyoxyethylene ether, lauryl polyoxyethylene ether, sorbitan monooleate polyoxyethylene ether, and monodecanoyl sucrose.

The heat-sensitive transfer recording sheet of the present invention may contain a wax so as to attain sufficient lubricity at the time when not heated with the thermal heat. Examples of the wax that may be contained include, but are not limited to, a polyethylene wax, a paraffin wax and a fatty acid ester wax.

The heat-sensitive transfer recording sheet of the present invention may contain, if necessary, an ultraviolet absorber, an antiseptic agent, an antioxidant, an antistatic agent, and a viscosity modifier in addition to the aforementioned additives.

The base film used as the substrate of the heat-sensitive transfer recording sheet of the present invention is not especially limited, and the following materials showing excellent heat resistance can be suitably used: Heat-resistant condenser paper, thin paper such as glassine paper, and films of plastics such as polyester, polycarbonate, polyamide, polyimide and polyaramide. In particular, a polyethylene terephthalate film is suitably used from the viewpoint of mechanical strength, solvent resistance and economic efficiency. The thickness of the substrate can be 3 to 50 μm from the viewpoint of the transferrability.

The heat-sensitive transfer recording sheet of the present invention can be provided, on a face of the substrate opposite to the face having the coloring material layer, with a layer of a lubricant, heat-resistant fine particles with high lubricity, and a thermal resin such as a binding resin, for purposes of improving the heat resistance and the travelling performance of the thermal head. Examples of the lubricant include an amino-modified silicone compound and a carboxyl-modified silicone compound. Examples of the heat-resistant fine particles include fine particles such as silica, and an example of the binder resin includes an acrylic resin, but these examples do not limit these substances.

The disperser used in the dispersion step is not especially limited, and a media type disperser such as a rotary shearing homogenizer, a ball mill, a sand mill or an attritor, or a high-pressure counter collision disperser can be used.

A method for applying the composition on the base film is not especially limited, and methods using a bar coater, a gravure coater, a reverse roll coater, a rod coater, and an air doctor coater can be employed. With respect to the amount of ink composition to be applied, the composition can be applied so as to attain a thickness of the coloring material layer after drying in the range of 0.1 to 5 μm from the viewpoint of the transferrability.

Methods for heating the heat-sensitive transfer recording sheet of the present invention is not especially limited, and not only a general method using a thermal head but also a method using infrared rays or laser beams can be employed. Alternatively, the heat-sensitive transfer recording sheet of the present invention may be used as an electrical dye transfer sheet by using, as the base film itself, an electrically exothermic film that generates heat when electricity flows therein.

As described so far, the heat-sensitive transfer recording sheet of the present invention can be provided as a heat-sensitive transfer recording sheet with high saturation and high light resistance.

<Resist Composition for Color Filter>

Next, the resist composition for a color filter of the present invention will be described.

The coloring matter compound of the present invention can be suitably used for a resist composition for a color filter.

The resist composition for a color filter of the present invention contains a binding resin, a medium and the coloring matter compound of the present invention.

The resist composition for a color filter of the present invention is obtained as follows: The coloring matter compound and a binding resin are added to a medium with stirring. At this point, a polymerizable monomer, a polymerization initiator and a photoacid generator may be added if necessary. Thereafter, the aforementioned materials are stably dissolved or finely dispersed in the medium by applying mechanical shearing force with a disperser, and thus, the resist composition for a color filter of the present invention can be obtained.

The binding resin usable in the resist composition for a color filter of the present invention can be such a resin that at least either an exposed portion or a shielded portion thereof obtained in an exposure step for forming picture elements can be dissolved in an organic solvent, an alkaline aqueous solution, water or a commercially available developer. In particular, from the viewpoint of workability and a treatment performed after producing a resist, a resin having a composition that can be developed with water or an alkaline aqueous solution can be suitably used.

If the resist composition for a color filter of the present invention is a negative resist composition, a polymerizable monomer that is addition polymerized by exposure (hereinafter also referred to as the photopolymerizable monomer) can be used. The photopolymerizable monomer can be a compound having, in a molecule, at least one or more addition polymerizable ethylenically unsaturated double bonds and having a boiling point of 100° C. or more under normal pressure. Specific examples include polyfunctional acrylates and polyfunctional methacrylates obtained by adding ethylene oxide or propylene oxide to a monofunctional acrylate, a polyfunctional acrylate or methacrylate, or a polyfunctional alcohol, and by acrylating or methacrylating the resultant. Examples of the monofunctional acrylate include polyethylene glycol monoacrylate, polyethylene glycol monomethacrylate, polypropylene glycol monoacrylate, polypropylene glycol monomethacrylate, phenoxyethyl acrylate, and phenoxyethyl methacrylate. Examples of the polyfunctional acrylate or methacrylate include polyethylene glycol diacrylate, polyethylene glycol dimethacrylate, polypropylene glycol diacrylate, polypropylene glycol dimethacrylate, trimethylolethane triacrylate, trimethylolethane trimethacrylate, trimethylolpropane triacrylate, trimethylolpropane trimethacrylate, trimethylolpropane diacrylate, trimethylolpropane dimethacrylate, neopentyl glycol diacrylate, neopentyl glycol dimethacrylate, pentaerythritol tetraacrylate, pentaerythritol tetramethacrylate, pentaerythritol triacrylate, pentaerythritol trimethacrylate, dipentaerythritol hexaacrylate, dipentaerythritol hexamethacrylate, dipentaerythritol pentaacrylate, dipentaerythritol pentamethacrylate, hexanediol diacrylate, hexanediol dimethacrylate, trimethylolpropane tri(acryloyloxypropyl) ether, tri(acryloyloxyethyl) isocyanurate, tri(acryloyloxyethyl) cyanurate, glycerin triacrylate, and glycerin trimethacrylate. Examples of the polyfunctional alcohol include trimethylolpropane and glycerin. Other examples of the photopolymerizable monomer include urethane acrylates, polyester acrylates, and polyfunctional epoxy acrylates and epoxy methacrylates obtained as reaction products of an epoxy resin and an acrylic acid or methacrylic acid. Among the aforementioned monomers, trimethylolpropane triacrylate, trimethylolpropane trimethacrylate, pentaerythritol tetraacrylate, pentaerythritol tetramethacrylate, dipentaerythritol hexaacrylate, dipentaerythritol hexamethacrylate, dipentaerythritol pentaacrylate and dipentaerythritol pentamethacrylate can be particularly suitably used.

One of these photopolymerizable monomers may be singly used, or two or more of these may be used in combination if necessary.

The content of the photopolymerizable monomer is preferably 5 to 50% by mass and more preferably 10 to 40% by mass based on the mass (total solids) of the resist composition of the present invention. If the content is 5 to 50% by mass, sensitivity to the exposure and the strength of picture elements can be further improved, and in addition, the viscosity of the resist composition can be placed in an appropriate state.

If the resist composition for a color filter of the present invention is a negative resist composition, a photopolymerization initiator may be added. Examples of the photopolymerization initiator include a vicinalpolyketoaldonyl compound, an α-carbonyl compound, acyloin ether, a multi-branch quinone compound, a combination of a triallylimidazole dimer and p-aminophenylketone, and a trioxadiazole compound. In particular, 2-benzyl-2-dimethylamino-1-(4-morpholinophenyl) butanone (trade name: IRGACURE 369, manufactured by BASF) can be suitably used. Incidentally, if electron beams are used for forming picture elements by using the coloring resist of the present invention, it is not always necessary to use the photopolymerization initiator.

If the resist composition for a color filter of the present invention is a positive resist composition, a photoacid generator may be added as occasion demands. As the photoacid generator, known photoacid generators such as a salt of onium ions of sulfonium, iodonium, selenium, ammonium or phosphonium, and anions can be used.

Examples of the sulfonium ions include those of triphenylsulfonium, tri-p-tolylsulfonium, tri-o-tolylsulfonium, tris(4-methoxyphenyl)sulfonium, 1-naphthyldiphenylsulfonium, diphenylphenacylsulfonium, phenylmethylbenzylsulfonium, 4-hydroxyphenylmethylbenzylsulfonium, dimethylphenacylsulfonium, and phenacyltetrahydrothiophenium.

Examples of the iodonium ions include those of diphenyliodonium, di-p-tolyliodonium, bis(4-dodecylphenyl)iodonium, bis(4-methoxyphenyl)iodonium, and (4-octyloxyphenyl)phenyliodonium.

Examples of the selenium ions include those of triarylselenium (triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphtylselenium, and tri-2-naphtylselenium).

Examples of the ammonium ions include those of tetraalkylammonium (tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, and trimethylisobutylammonium).

Examples of the phosphonium ions include those of tetraphenylphosphonium, tetra-p-tolylphosphonium, tetrakis (2-methoxyphenyl)phosphonium, triphenylbenzylphosphonium, triphenylphenacylphosphonium, triphenylmethylphosphonium, triethylbenzylphosphonium, and tetraethylphosphonium.

Examples of the anions include, but are not limited to, halogen acid ions such as $ClO_4^-$ and $BrO_4^-$, halogenated sulfonic acid ions such as $FSO_3^-$ and $ClSO_3^-$, sulfuric acid ions such as $CH_3SO_4^-$, $CF_3SO_4^-$ and $HSO_4^-$, carbonic acid ions such as $HCO_3^-$ and $CH_3CO_3^-$, aluminic acid ions such as $AlCl_4^-$ and $AlF_4^-$, hexafluorobismuthic acid ions, carboxylic acid ions such as $CH_3COO^-$, $CF_3COO^-$, $C_6H_5COO^-$, $CH_3C_6H_4COO^-$, $C_6F_5COO^-$, and $CF_3C_6H_4COO^-$, arylboric acid ions such as $B(C_6H_5)_4^-$ and $CH_3CH_2CH_2CH_2B(C_6H_5)_3^-$, thiocyanic acid ions, and nitric acid ions.

In the resist composition for a color filter of the present invention, the medium used for dissolving or dispersing the coloring matter compound, the binding resin, and the photopolymerizable monomer, the photopolymerization initiator and the photoacid generator added as occasion demands, can be water or an organic solvent. Examples of the organic solvent include cyclohexanone, ethyl cellosolve acetate, butyl cellosolve acetate, 1-methoxy-2-propyl acetate, diethylene glycol dimethyl ether, ethyl benzene, 1,2,4-trichlorobenzene, ethylene glycol diethyl ether, xylene, ethyl cellosolve, methyl-n-amyl ketone, propylene glycol monomethyl ether, toluene, methyl ethyl ketone, ethyl acetate, methanol, ethanol, isopropanol, butanol, methyl isobutyl ketone, and a petroleum solvent. One of these solvents may be singly used, or two or more of these may be used in combination. Furthermore, the medium of the resist composition for a color filter of the present invention can be the same as or different from the medium used together with the coloring matter compound as long as the dispersibility of the coloring matter compound is not impeded.

In a color filter of the present invention, the resist composition of the present invention is used in picture elements of at least one color, out of two or more kinds of picture elements adjacently arranged and having different spectral properties. In this manner, a color filter having excellent saturation and light resistance can be obtained. Furthermore, in order to attain desired spectral properties, another dye may be used together for purpose of color matching. Dyes that can be used together are not especially limited, and examples include C.I. Solvent Blue 14, 24, 25, 26, 34, 37, 38, 39, 42, 43, 44, 45, 48, 52, 53, 55, 59, 67 and 70; C.I. Solvent Red 8, 27, 35, 36, 37, 38, 39, 40, 49, 58, 60, 65, 69, 81, 83:1, 86, 89, 91, 92, 97, 99, 100, 109, 118, 119, 122, 127 and 218.

The resist composition for a color filter of the present invention may contain, in addition to the aforementioned additives, an ultraviolet absorber, or a silane coupling agent used for improving adhesion to a glass substrate in producing a filter, as occasion demands.

As described so far, the resist composition for a color filter of the present invention contains the coloring matter compound of the present invention having high saturation and high light resistance, and therefore, a resist compound for a color filter having high saturation and high light resistance can be provided.

EXAMPLES

The present invention will now be described in more detail with reference to examples and comparative examples, and it is noted that the present invention is not limited to these examples. In the following description, the terms "part(s)" and "%" are used on a mass basis unless otherwise mentioned. Obtained reaction products were identified by using a ¹H nuclear magnetic resonance (¹H-NMR) spectrometer (ECA-400, manufactured by JEOL Ltd.) and a matrix-assisted laser desorption-ionization mass spectrometer (MALDI-TOF-MS) (Autoflex, manufactured by Bruker Daltonics Inc.). Incidentally, in the MALDI-TOF-MS, a negative mode was employed for ion detection.

[Preparation of Coloring Matter Compound Having a Structure Represented by the General Formula (1)]

A coloring matter compound having a structure represented by the general formula (1) of the present invention can be synthesized by referring to known methods and the like.

Coloring matter compounds having a structure represented by the general formula (1) of the present invention were prepared as follows:

Example 1

Preparation of Compound (1)

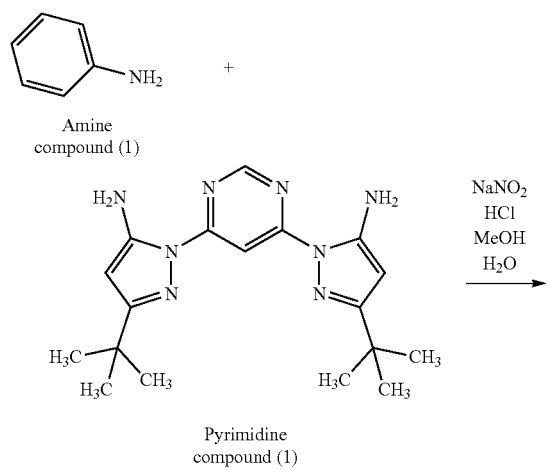

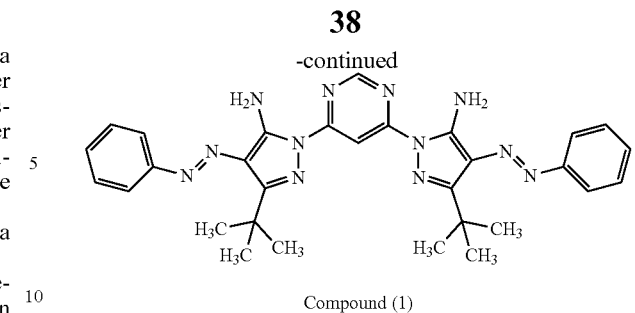

Compound (1)

A 20 mL of methanol solution of 1.03 g of an amine compound (1) was cooled to 5° C., and 3 mL of 35% hydrochloric acid was added dropwise thereto. To the resulting solution, 5 mL of a water solution of 0.86 g of sodium nitrite was added dropwise (to give a diazotization solution A). Separately, 30 mL of a methanol solution of 1.78 g of a pyrimidine compound (1) was cooled to 5° C., and the diazotization solution A was slowly added dropwise thereto with the temperature kept at 5° C. or lower, and the resulting solution was further stirred for 1 hour at 0 to 5° C. After completing the reaction, the resulting solution was neutralized to pH 6 by adding a sodium carbonate aqueous solution dropwise thereto, and the thus precipitated solid was filtrated and washed with water. The obtained solid was dispersedly washed with toluene, so as to give 1.78 g of a compound (1). FIG. 1 illustrates the ¹H NMR spectrum of the compound (1) obtained in CDCl₃ at room temperature and 400 MHz.

[Analysis Result of Compound (1)]

[1] ¹H-NMR (400 MHz, CDCl₃, room temperature): δ (ppm)=8.71 (1H, s), 8.59 (4H, br), 8.39 (1H, s), 7.73 (4H, d), 7.46 (4H, dd), 7.33 (2H, t), 1.58 (18H, s).

[2] MALDI-TOF Mass Spectrometry: m/z=561.095 (M-H)

Example 2

Preparation of Compound (4)

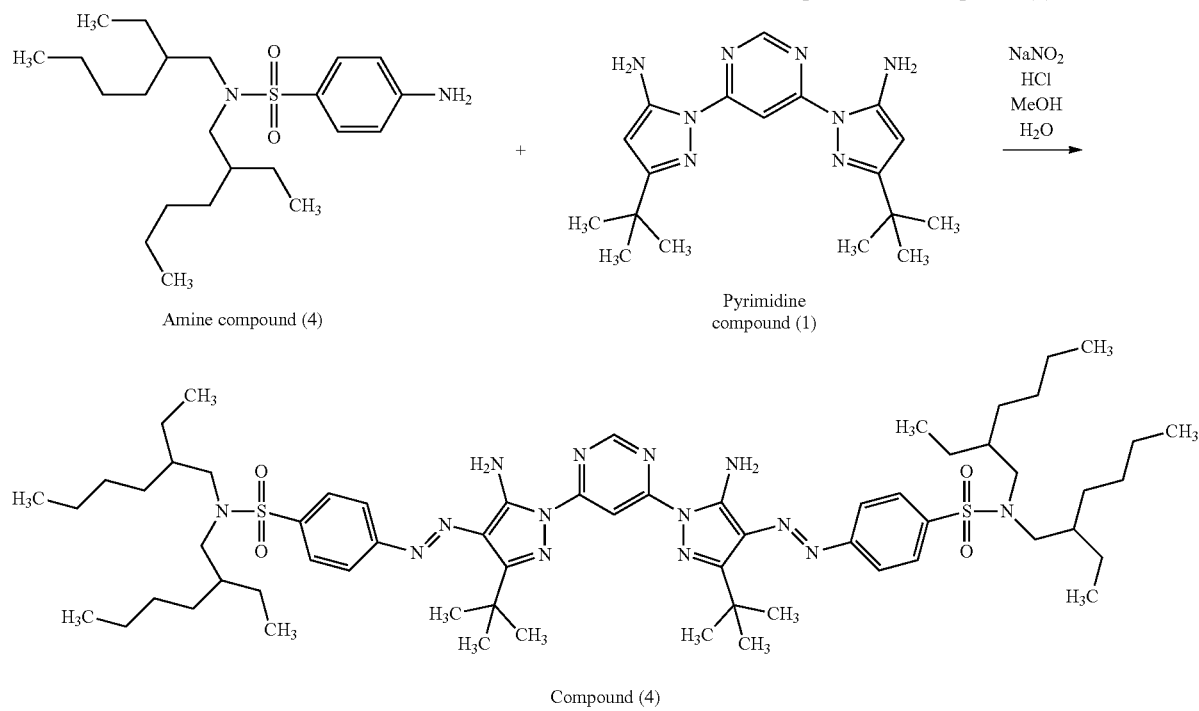

Compound (4)

A 30 mL of methanol solution of 1 g of an amine compound (4) was cooled to 5° C., and 0.7 mL of 35% hydrochloric acid was added dropwise thereto. To the resulting solution, 3 mL of a water solution of 0.2 g of sodium nitrite was added dropwise, followed by stirring for 1 hour. Thereafter, 0.03 g of amidosulfuric acid was added to decompose excessive sodium nitrite, thereby obtaining a diazotization solution B. Separately, 30 mL of a methanol solution of 0.41 g of the pyrimidine compound (1) was cooled to 5° C., and the diazotization solution B was slowly added dropwise thereto with the temperature kept at 5° C. or lower, and the resulting solution was further stirred for 1 hour at 0 to 5° C. After completing the reaction, the resulting solution was neutralized to pH 6 by adding a sodium carbonate aqueous solution dropwise thereto, followed by extraction with chloroform. The thus obtained chloroform layer was concentrated, and the resulting solid was recrystallized with a toluene/ethanol solution, so as to give 1.3 g of a compound (4).

[Analysis Result of Compound (4)]

[1] $^1$H-NMR (400 MHz, CDCl$_3$, room temperature): δ (ppm)=8.83-8.72 (5H, m), 8.39 (1H, s), 7.86 (4H, d), 7.79 (4H, d), 3.78-3.68 (8H, m), 1.58 (18H, s), 1.45-1.15 (34H, m), 0.93-0.81 (26H, m).

[2] MALDI-TOF Mass Spectrometry: m/z=1167.886 (M-H)

Example 3

Preparation of Compound (10)

decompose excessive nitrosylsulfuric acid, thereby obtaining a diazotization solution C. Separately, mL of a dimethylformamide solution of 0.71 g of a pyrimidine compound (1) was cooled to 5° C., and the diazotization solution C was slowly added dropwise thereto with the temperature kept at 5° C. or lower, and the resulting solution was further stirred for 2 hours at 0 to 5° C. After completing the reaction, the resulting solution was extracted with chloroform. The thus obtained chloroform layer was concentrated, the resulting solid was purified by gel permeation chromatography (eluent: chloroform), and the resultant was washed with methanol, so as to give 0.55 g of a compound (10).

[Analysis Result of Compound (10)]

[1] $^1$H-NMR (400 MHz, CDCl$_3$, room temperature): δ (ppm)=8.73 (1H, s), 8.68-8.63 (4H, br), 8.39 (1H, s), 7.73 (4H, d), 7.46 (4H, d), 3.50-3.44 (4H, m), 3.26-3.22 (4H, m), 1.85-1.79 (2H, m), 1.58 (18H, s), 1.45-0.71 (58H, m).

[2] MALDI-TOF Mass Spectrometry: m/z=1095.915 (M-H)

Example 4

Preparation of Compound (16)

A compound (16) was obtained in the same manner as in Example 1 except that the amine compound (1) was changed to a corresponding amine compound.

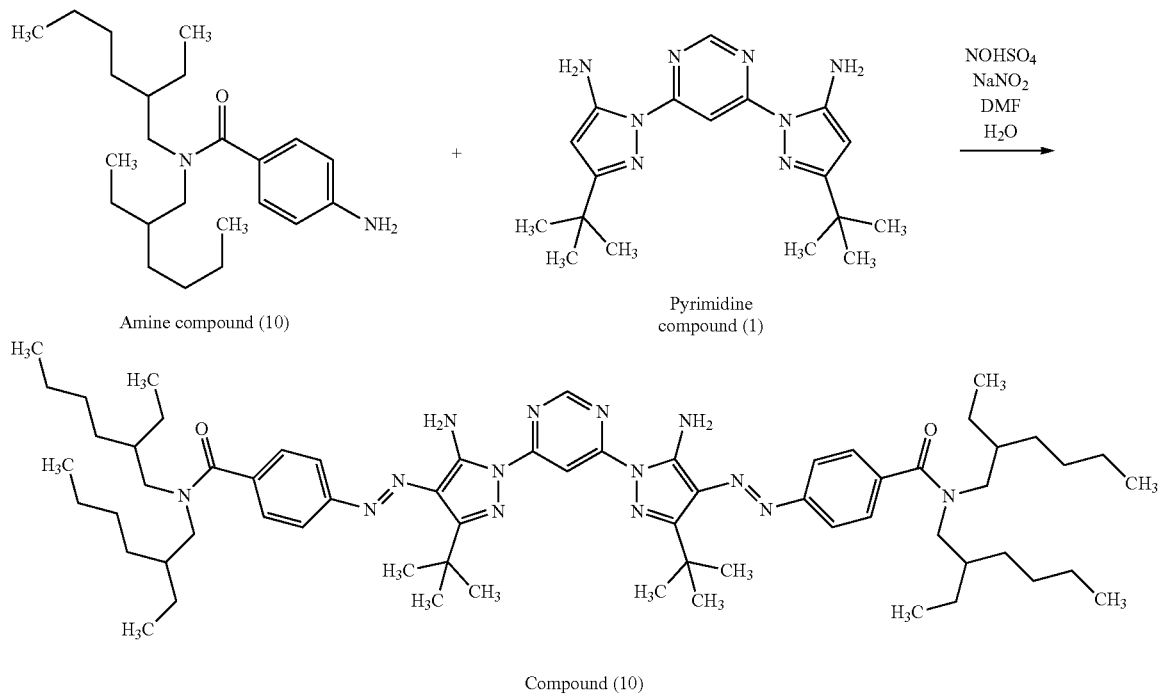

A 20 mL of N,N-dimethylformamide (DMF) solution of 1.59 g of an amine compound (10) was cooled to 5° C., and 10 mL of a N,N-dimethylformamide (DMF) solution of 40% nitrosylsulfuric acid was slowly added dropwise thereto. To the resulting solution, 3 mL of a water solution of 0.345 g of sodium nitrite was added dropwise, followed by stirring for 1 hour. Thereafter, 0.06 g of amidosulfuric acid was added to

[Analysis Result of Compound (16)]

[1] $^1$H-NMR (400 MHz, CDCl$_3$, room temperature): δ (ppm)=8.70 (1H, s), 8.68-8.52 (4H, br), 8.34 (1H, s), 7.75-7.68 (2H, m), 7.45-7.37 (2H, m), 7.32-7.27 (4H, m), 3.21-3.15 (4H, m), 2.99-2.88 (4H, m), 1.86-1.80 (2H, m), 1.58 (18H, s), 1.45-0.45 (58H, m).

[2] MALDI-TOF Mass Spectrometry: m/z=1095.821 (M-H)

Example 5

Preparation of Compound (22)

A compound (22) was obtained in the same manner as in Example 1 except that the amine compound (1) was changed to a corresponding amine compound.

[Analysis Result of Compound (22)]

[1] $^1$H-NMR (400 MHz, CDCl$_3$, room temperature): δ (ppm)=8.79-8.60 (5H, m), 8.34 (1H, s), 7.71-7.66 (2H, m), 7.35-7.29 (4H, m), 3.42-2.90 (16H, m), 1.85-1.74 (4H, m), 1.57 (18H, s), 1.49-0.38 (116H, m).

[2] MALDI-TOF Mass Spectrometry: m/z=1630.243 (M-H)$^-$

Example 6

Preparation of Compound (36)

A compound (36) was obtained in the same manner as in Example 3 except that the pyrimidine compound (1) was changed to a triazine compound (1).

Triazine compound (1)

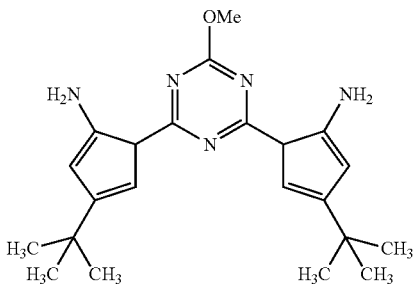

[Analysis Result of Compound (36)]

[1] MALDI-TOF Mass Spectrometry: m/z=1127.931 (M-H)$^-$

Example 7

Preparation of Compound (37)

A compound (37) was obtained in the same manner as in Example 1 except that the pyrimidine compound (1) was changed to the triazine compound (1).

[Analysis Result of Compound (37)]

[1] MALDI-TOF Mass Spectrometry: m/z=592.262 (M-H)$^-$

Example 8

Preparation of Compound (38)

A compound (38) was obtained in the same manner as in Example 4 except that the pyrimidine compound (1) was changed to the triazine compound (1).

[Analysis Result of Compound (38)]

[1] MALDI-TOF Mass Spectrometry: m/z=1126.180 (M-H)$^-$

Example 9

Preparation of Compound (39)

A compound (39) was obtained in the same manner as in Example 1 except that the amine compound (1) was changed to a corresponding amine compound.

[Analysis Result of Compound (39)]

[1] MALDI-TOF Mass Spectrometry: m/z=1169.742 (M-H)$^-$

Example 10

Preparation of Compound (40)

A compound (40) was obtained in the same manner as in Example 1 except that the amine compound (1) was changed to a corresponding amine compound.

[Analysis Result of Compound (40)]

[1] $^1$H-NMR (400 MHz, CDCl$_3$, room temperature): δ (ppm)=9.54 (4H, br), 8.72 (1H, s), 8.34 (1H, s), 7.79 (2H, d), 7.49 (2H, t), 7.40 (2H, t), 3.82 (2H, br), 3.24-2.87 (8H, m), 1.48 (18H, s), 1.36-1.26 (4H, m), 1.15-0.98 (8H, m), 0.89 (3H, t), 0.73 (3H, t).

<Production of Ink>

Inks of the present invention and comparative inks were produced as follows:

[Production Example of Ink (1)]

Five parts of the compound (1), that is, a coloring matter compound of the present invention, 350 parts of toluene, 350 parts of ethyl acetate and 300 parts of 2-butanone were mixed to produce an ink (1) of the present invention.

[Production Examples of inks (4), (10), (16), (22), (36), (37), (38), (39) and (40)]

Inks (4), (10), (16), (22), (36), (37), (38), (39) and (40) were obtained in the same manner as in Production Example of the ink (1) except that the compound (1) used as the coloring matter compound was changed to the compounds (4), (10), (16), (22), (36), (37), (38), (39) and (40).

[Production Examples of comparative inks (1) and (2)]

Comparative inks (1) and (2) were obtained in the same manner as in Production Example of the ink (1) except that the compound (1) used as the coloring matter compound was changed to the following comparative compounds (1) and (2):

Comparative compound (1)

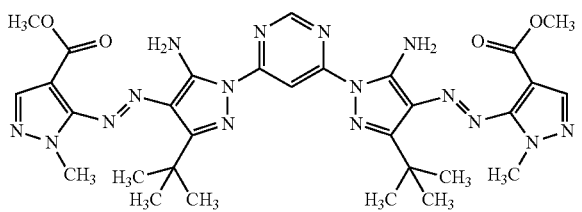

Comparative compound (2)

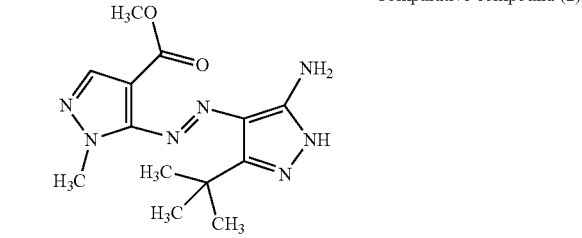

<Evaluation>

<Preparation of Samples>

Image samples were prepared by applying, by a bar coating method (with a bar No. 10), the inks (1), (4), (10), (16), (22), (36), (37), (38), (39) and (40) and the comparative inks (1) and (2) on hiding charts and air-drying the resulting charts overnight. Each of the thus prepared image samples was measured for chromaticity (L*, a* and b*) in the L*a*b* color system by using a reflection densitometer, Spectro Lino (manufactured by Gretag Macbeth AG). Saturation (c*) was calculated based on the measured values of the color characteristics according to the following expression:

$$c^* = \sqrt{(a^*)^2 + (b^*)^2}.$$

[Evaluation of Saturation]

The saturation was evaluated as follows:

If the amount of coloring agent per unit area is the same, as the saturation c* is larger, it can be said that the brightness and the saturation are better. Evaluation was made by using the saturation c* obtained in the preparation of each image sample by the bar coating method (with the bar No. 10). Incidentally, the evaluation was made based on the values of a* and b* obtained when the value L* was 92. The values a* and b* obtained when the value L* was 92 were calculated by interpolation of the values L*, a* and b* obtained in each image sample.

A: The value c* is 100 or more (which means that the saturation is extremely high);

B: The value c* is 90 or more and less than 100 (which means that the saturation is high); and C: The value c* is less than 90 (which means that the saturation is low).

[Evaluation of Light Resistance]

Each image sample obtained for the saturation measurement was loaded in a xenon weatherometer (Atlas Ci 4000, manufactured by Suga Test Instruments Co., Ltd.), and was exposed for 50 hrs. under conditions of illumination of 0.39 W/m$^2$ at 340 nm, a temperature of 40° C. and relative humidity of 60%. The reflection density of the printed product was measured before and after the test. Assuming that the initial chromaticity values were $a_0^*$, $b_0^*$ and $L_0^*$, and that the chromaticity values attained after the exposure were a*, b* and L*, a color difference ΔE was defined and calculated as follows:

$$\Delta E = \sqrt{(a^* - a^*_0)^2 + (b^* - b^*_0)^2 + (L^* - L^*_0)^2}.$$

Evaluation criteria are as follows:

A: ΔE<2.5 (which means that the light resistance is extremely excellent);

B: 2.5≤ΔE<5 (which means that the light resistance is excellent); and

C: 5≤ΔE (which means that the light resistance is poor).

The results of the above-described examples and comparative examples are shown in Table 1 below.

TABLE 1

| Ink | Used compound | c* obtained when L* = 92/ Evaluation of saturation | Light resistance ΔE/ Evaluation of light resistance |
|---|---|---|---|
| Example 1 | Ink (1) | Compound (1) | 95.3/B | 4.83/B |
| Example 2 | Ink (4) | Compound (4) | 106/A | 2.46/A |
| Example 3 | Ink (10) | Compound (10) | 96.0/B | 1.78/A |
| Example 4 | Ink (16) | Compound (16) | 98.0/B | 1.39/A |
| Example 5 | Ink (22) | Compound (22) | 106/A | 4.32/B |
| Example 6 | Ink (36) | Compound (36) | 94.1/B | 4.11/B |
| Example 7 | Ink (37) | Compound (37) | 90.2/B | 4.79/B |
| Example 8 | Ink (38) | Compound (38) | 95.8/B | 3.74/B |
| Example 9 | Ink (39) | Compound (39) | 101/A | 1.97/A |
| Example 10 | Ink (40) | Compound (40) | 104/A | 2.16/A |
| Comparative Example 1 | Comparative ink (1) | Comparative compound (1) | 75.6/C | 4.38/B |
| Comparative Example 2 | Comparative ink (2) | Comparative compound (2) | 79.3/C | 14.8/C |

As is obvious from Table 1, it is understood that the inks produced by using the coloring matter compounds of the present invention have higher saturation and better light resistance than the inks produced by using the comparative compounds.

<Preparation of Resist Composition for Color Filter>

Example 11

Twelve parts of the compound (1), that is, a coloring matter compound of the present invention, was mixed with 120 parts of cyclohexanone, and dispersed for 1 hour by using an attritor (manufactured by Mitsui Kozan KK), so as to give an ink (11) of the present invention.

To a solution, in 96 parts of cyclohexanone, of 6.7 parts of an acrylic copolymer composition (having a weight average molecular weight Mw of 10,000) containing, in a monomer ratio, 40% by mass of n-butyl methacrylate, 30% of acrylic acid and 30% of hydroxyethyl methacrylate, 1.3 parts of dipentaerythritol pentaacrylate, and 0.4 part of 2-benzyl-2-dimethylamino-1-(4-morpholinophenyl)-butanone (serving as a photopolymerization initiator), 22 parts of the ink (11) was slowed added, followed by stirring at room temperature for 3 hours. The resulting solution was filtered with a 1.5 μm filter, so as to give a resist composition (1) for a color filter of the present invention.

The resist composition (1) for a color filter was spin-coated on a glass substrate, and dried at 90° C. for 3 minutes, and the resultant was wholly exposed and post-cured at 180° C., thereby producing a color filter (1).

Examples 12 to 15

Resist compositions (10), (16), (36) and (37) for a color filter were obtained in the same manner as in the preparation example of Example 11 except that the coloring matter compound (1) was changed to the compounds (10), (16), (36) and (37). Thereafter, color filters (10), (16), (36) and (37) were obtained in the same manner as in Example 11 except that the resist compositions (10), (16), (36) and (37) for a color filter were used instead of the resist composition (1) for a color filter.

Comparative Examples 3 and 4

Comparative resist compositions (1) and (25) for a color filter were obtained in the same manner as in Example except that the compound (1) was changed to the comparative compounds (1) and (2). Thereafter, comparative color filters (1) and (2) were obtained in the same manner as in Example 11 except that the comparative resist compositions (1) and (2) for a color filter were used instead of the resist composition (1) for a color filter.

<Production of Heat-Sensitive Transfer Recording Sheet>

Example 16

To a mixed solution, in 45 parts of methyl ethyl ketone and 45 parts of toluene, of 13.5 parts of the compound (4), that is, a coloring matter compound of the present invention, 5 parts of a polyvinyl butyral resin (Denka 3000-K, manufactured by Denki Kagaku Kogyo KK) was added in limited amounts with stirring, so as to give an ink (14) of the present invention.

The ink (14) was applied on a polyethylene terephthalate film (Lumirror, manufactured by Toray Industries, Inc.) having a thickness of 4.5 μm into a thickness of 1 μm after drying, and the resultant was dried, so as to produce a heat-sensitive transfer recording sheet (4).

Examples 17 to 20

Heat-sensitive transfer recording sheets (22), (38), (39) and (40) were obtained in the same manner as in the production example of Example 16 except that the compound (4) used as the coloring matter compound was changed to the compounds (22), (38), (39) and (40).

Comparative Examples 5 and 6

Comparative heat-sensitive transfer recording sheets (1) and (2) were obtained in the same manner as in Example 16 except that the compound (4) used as the coloring matter compound was changed to the comparative compounds (1) and (2).

[Evaluation of Saturation]

Evaluation of saturation was made by using saturation $c^*$ obtained in the production of each of the aforementioned color filters and heat-sensitive transfer recording sheets. Incidentally, the evaluation was made based on the values of $a^*$ and $b^*$ obtained when the value $L^*$ was 92. The values $a^*$ and $b^*$ obtained when the value $L^*$ was 92 were calculated by interpolation of the values $L^*$, $a^*$ and $b^*$ obtained in each sample.

A: The value $c^*$ is 100 or more (which means that the saturation is extremely high);

B: The value $c^*$ is 90 or more and less than 100 (which means that the saturation is high); and C: The value $c^*$ is less than 90 (which means that the saturation is low).

[Evaluation of Light Resistance]

Each of the color filters and heat-sensitive transfer recording sheets was loaded in a xenon weatherometer (Atlas Ci 4000, manufactured by Suga Test Instruments Co., Ltd.), and was exposed for 30 hrs. under conditions of illumination of 0.39 W/m² at 340 nm, a temperature of 40° C. and relative humidity of 60%. The reflection density of the printed product was measured before and after the test. Assuming that the initial chromaticity values were $a_0^*$, $b_0^*$ and $L_0^*$, and that the chromaticity values attained after the exposure were $a^*$, $b^*$ and $L^*$, a color difference $\Delta E$ was defined and calculated as follows. The results are shown in Table 2 below.

$$\Delta E = \sqrt{(a^*-a^*_0)^2+(b^*-b^*_0)^2+(L^*-L^*_0)^2}.$$

Evaluation criteria are as follows:

A: $\Delta E < 2.5$ (which means that the light resistance is extremely excellent);

B: $2.5 \leq \Delta E < 5$ (which means that the light resistance is excellent); and C: $5 \leq \Delta E$ (which means that the light resistance is poor).

TABLE 2

| | Compound | Application | $c^*$ obtained when $L^*$ = 92/ Evaluation of saturation | Light resistance $\Delta E$/ Evaluation of light resistance |
|---|---|---|---|---|
| Example 11 | Compound (1) | Color filter (1) | 92.5/B | 4.33/B |
| Example 12 | Compound (10) | Color filter (10) | 107/A | 1.98/A |
| Example 13 | Compound (16) | Color filter (16) | 94.0/B | 2.02/A |
| Example 14 | Compound (36) | Color filter (36) | 99.0/B | 4.85/B |
| Example 15 | Compound (37) | Color filter (37) | 101/A | 4.98/B |
| Example 16 | Compound (4) | Heat-sensitive transfer sheet (4) | 91.1/B | 2.75/B |
| Example 17 | Compound (22) | Heat-sensitive transfer sheet (22) | 90.9/B | 4.64/B |
| Example 18 | Compound (38) | Heat-sensitive transfer sheet (38) | 95.9/B | 3.77/B |
| Example 19 | Compound (39) | Heat-sensitive transfer sheet (39) | 108/A | 2.68/B |
| Example 20 | Compound (40) | Heat-sensitive transfer sheet (40) | 103/A | 2.42/A |
| Comparative Example 3 | Comparative compound (1) | Comparative color filter (1) | 80.6/C | 4.41/B |
| Comparative Example 4 | Comparative compound (2) | Comparative color filter (2) | 82.3/C | 12.3/C |
| Comparative Example 5 | Comparative compound (1) | Comparative heat-sensitive transfer sheet (1) | 77.5/C | 5.06/C |
| Comparative Example 6 | Comparative compound (2) | Comparative heat-sensitive transfer sheet (2) | 78.1/C | 15.6/C |

As is obvious from Table 2, it is understood that the color filters and the heat-sensitive transfer recording sheets containing the compounds of the present invention have higher saturation and better light resistance than the color filters and the heat-sensitive transfer recording sheets containing the comparative compounds.

Industrial Applicability

According to the present invention, a coloring matter compound having high saturation and high light resistance, and an ink, a heat-sensitive transfer recording sheet and a resist composition for a color filter all containing the coloring matter compound are provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2012-184755, filed Aug. 24, 2012, and No.

2013-172347, filed Aug. 22, 2013 which are hereby incorporated by reference herein in their entirety.

What is claimed is:

1. A coloring matter compound having a structure represented by general formula (1):

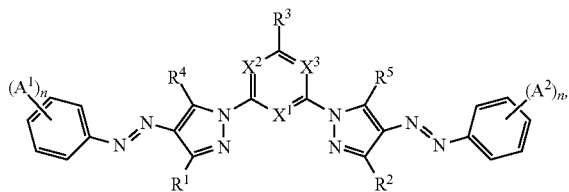

(1)

wherein $R^1$ and $R^2$ each independently represent a hydrogen atom, an alkyl group or an aryl group, $R^3$ represents a hydrogen atom, an alkyl group, an aryl group, or an alkoxy group, $R^4$ and $R^5$ each independently represent a hydrogen atom or an amino group, $X^1$ represents a carbon atom or a nitrogen atom, $X^2$ and $X^3$ each represent a nitrogen atom, $A^1$ and $A^2$ each independently represent a hydrogen atom, an alkyl group, an alkoxy group, an aryl group, a carbamoyl group, a carboxylic acid ester group, a carboxylic acid amide group, a sulfonic acid ester group, a sulfonic acid amide group, a trifluoromethyl group, a cyano group, a hydroxy group, a nitro group, an amino group or a halogen atom, and n represents an integer of 1 to 5.

2. The coloring matter compound according to claim 1, wherein, in the general formula (1), the alkyl group as $R^1$ and $R^2$ is a primary, secondary or tertiary alkyl group having 1 to 20 carbon atoms, and the aryl group as $R^1$ and $R^2$ is a phenyl group, a methyl phenyl group or a dimethyl phenyl group.

3. The coloring matter compound according to claim 1, wherein, in the general formula (1), $A^1$ and $A^2$ each independently represent a carboxylic acid ester group, a carboxylic acid amide group, a sulfonic acid ester group or a sulfonic acid amide group.

4. An ink comprising the coloring matter compound according to claim 1.

5. A heat-sensitive transfer recording sheet comprising:
a substrate; and
a coloring material layer formed on the substrate and containing the coloring matter compound according to claim 1.

6. A resist composition for a color filter comprising the coloring matter compound according to claim 1.

* * * * *